(12) United States Patent
Kumaki et al.

(10) Patent No.: US 8,368,059 B2
(45) Date of Patent: *Feb. 5, 2013

(54) LIGHT EMITTING ELEMENT AND LIGHT EMITTING DEVICE USING THE SAME

(75) Inventors: Daisuke Kumaki, Tokamachi (JP); Satoshi Seo, Kawasaki (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

This patent is subject to a terminal disclaimer.

(21) Appl. No.: 12/987,379

(22) Filed: Jan. 10, 2011

(65) Prior Publication Data

US 2011/0101345 A1    May 5, 2011

Related U.S. Application Data

(63) Continuation of application No. 10/582,249, filed as application No. PCT/JP2005/013516 on Jul. 15, 2005, now Pat. No. 7,893,427.

(30) Foreign Application Priority Data

Jul. 23, 2004  (JP) ................................. 2004-216503
Mar. 17, 2005 (JP) ................................. 2005-076184

(51) Int. Cl.
H01L 29/08   (2006.01)
H01L 35/24   (2006.01)
H01L 51/00   (2006.01)

(52) U.S. Cl. .................... 257/40; 257/79; 257/E33.001

(58) Field of Classification Search ................... 257/40, 257/79, E33.001

See application file for complete search history.

(56) References Cited

U.S. PATENT DOCUMENTS

| | | |
|---|---|---|
| 5,404,075 A | 4/1995 | Fujikawa et al. |
| 5,596,208 A | 1/1997 | Dodabalapur et al. |
| 5,989,737 A | 11/1999 | Xie et al. |
| 6,013,384 A | 1/2000 | Kido et al. |
| 6,278,127 B1 | 8/2001 | Dodabalapur et al. |
| 6,337,492 B1 | 1/2002 | Jones et al. |

(Continued)

FOREIGN PATENT DOCUMENTS

| | | |
|---|---|---|
| CN | 1327360 | 12/2001 |
| EP | 0 716 459 | 6/1996 |

(Continued)

OTHER PUBLICATIONS

International Search Report for PCT/JP2005/013516 dated Nov. 1, 2005.

(Continued)

*Primary Examiner* — Phat X Cao
(74) *Attorney, Agent, or Firm* — Eric J. Robinson; Robinson Intellectual Property Law Office, P.C.

(57) ABSTRACT

An object of the present invention is to provide a light emitting element having slight increase in driving voltage with accumulation of light emitting time. Another object of the invention is to provide a light emitting element having slight increase in resistance value with increase in film thickness. A light emitting element of the invention includes a first layer for generating holes, a second layer for generating electrons and a third layer comprising a light emitting substance between first and second electrodes. The first and third layers are in contact with the first and second electrodes, respectively. The second and third layers are connected to each other so as to inject electrons generated in the second layer into the third layer when applying the voltage to the light emitting element such that a potential of the second electrode is higher than that of the first electrode.

16 Claims, 26 Drawing Sheets

U.S. PATENT DOCUMENTS

| | | |
|---|---|---|
| 6,344,283 B1 | 2/2002 | Inoue et al. |
| 6,380,687 B1 | 4/2002 | Yamazaki |
| 6,423,429 B2 | 7/2002 | Kido et al. |
| 6,483,236 B1 | 11/2002 | Hung |
| 6,486,601 B1 | 11/2002 | Sakai et al. |
| 6,489,638 B2 | 12/2002 | Seo et al. |
| 6,518,700 B1 | 2/2003 | Friend et al. |
| 6,552,496 B2 | 4/2003 | Yamazaki |
| 6,573,650 B2 | 6/2003 | Aoki et al. |
| 6,589,673 B1 | 7/2003 | Kido et al. |
| 6,593,691 B2 | 7/2003 | Nishi et al. |
| 6,608,449 B2 | 8/2003 | Fukunaga |
| 6,623,872 B2 | 9/2003 | Inoue et al. |
| 6,639,354 B1 | 10/2003 | Kojima et al. |
| 6,642,544 B1 | 11/2003 | Hamada et al. |
| 6,650,047 B2 | 11/2003 | Aoki et al. |
| 6,690,033 B2 | 2/2004 | Yamazaki et al. |
| 6,692,845 B2 | 2/2004 | Maruyama et al. |
| 6,717,358 B1 | 4/2004 | Liao et al. |
| 6,774,573 B2 | 8/2004 | Yamazaki |
| 6,794,278 B2 | 9/2004 | Kido et al. |
| 6,806,505 B2 | 10/2004 | Kojima et al. |
| 6,830,494 B1 | 12/2004 | Yamazaki et al. |
| 7,002,176 B2 | 2/2006 | Iechi et al. |
| 7,074,500 B2 | 7/2006 | Pfeiffer et al. |
| 7,097,918 B2 | 8/2006 | Inoue et al. |
| 7,141,817 B2 | 11/2006 | Nishi et al. |
| 7,158,161 B2 | 1/2007 | Gyoutoku et al. |
| 7,256,422 B2 | 8/2007 | Yamazaki |
| 7,276,728 B2 | 10/2007 | Iechi et al. |
| 7,323,225 B2 | 1/2008 | Aoki et al. |
| 7,732,808 B2 | 6/2010 | Ikeda et al. |
| 7,745,991 B2 | 6/2010 | Yamazaki et al. |
| 7,785,718 B2 | 8/2010 | Yatsunami et al. |
| 7,893,427 B2 * | 2/2011 | Kumaki et al. ............... 257/40 |
| 2001/0053559 A1 | 12/2001 | Nagao et al. |
| 2002/0160544 A1 | 10/2002 | Kojima et al. |
| 2002/0179918 A1 | 12/2002 | Sung et al. |
| 2003/0170491 A1 * | 9/2003 | Liao et al. ............... 428/690 |
| 2003/0189401 A1 * | 10/2003 | Kido et al. ............... 313/504 |
| 2004/0140758 A1 | 7/2004 | Raychaudhuri et al. |
| 2005/0073228 A1 * | 4/2005 | Tyan et al. ............... 313/110 |
| 2005/0084712 A1 | 4/2005 | Kido et al. |
| 2005/0084713 A1 | 4/2005 | Kido et al. |
| 2005/0098207 A1 * | 5/2005 | Matsumoto et al. ............ 136/263 |
| 2005/0106419 A1 | 5/2005 | Endoh et al. |
| 2006/0008740 A1 | 1/2006 | Kido et al. |
| 2008/0246395 A1 | 10/2008 | Nakai et al. |
| 2011/0101380 A1 * | 5/2011 | Kumaki et al. ............... 257/79 |

FOREIGN PATENT DOCUMENTS

| | | |
|---|---|---|
| EP | 0 855 848 | 7/1998 |
| EP | 0 891 121 | 1/1999 |
| EP | 0 948 063 | 10/1999 |
| EP | 0 975 027 | 1/2000 |
| EP | 1 009 198 | 6/2000 |
| EP | 1 065 723 | 1/2001 |
| EP | 1 089 361 | 4/2001 |
| EP | 1 093 167 | 4/2001 |
| EP | 1 128 438 | 8/2001 |
| EP | 1 160 891 | 12/2001 |
| EP | 1 261 042 | 11/2002 |
| EP | 1 351 558 | 10/2003 |
| EP | 1 524 706 | 4/2005 |
| EP | 1 524 707 | 4/2005 |
| EP | 1 530 245 | 5/2005 |
| EP | 1 617 493 | 1/2006 |
| EP | 1 978 574 | 10/2008 |
| GB | 2 417 827 | 3/2006 |
| JP | 01-312873 | 12/1989 |
| JP | 02-139892 | 5/1990 |
| JP | 03-114197 | 5/1991 |
| JP | 03-190088 | 8/1991 |
| JP | 03-274695 | 12/1991 |
| JP | 04-357694 | 12/1992 |
| JP | 05-182766 | 7/1993 |
| JP | 06-267658 | 9/1994 |
| JP | 06-290873 | 10/1994 |
| JP | 07-312289 | 11/1995 |
| JP | 08-228034 | 9/1996 |
| JP | 09-063771 | 3/1997 |
| JP | 10-255985 | 9/1998 |
| JP | 10-270171 | 10/1998 |
| JP | 10-308284 | 11/1998 |
| JP | 2824411 | 11/1998 |
| JP | 11-251067 | 9/1999 |
| JP | 11-297474 | 10/1999 |
| JP | 11-307259 | 11/1999 |
| JP | 11-307264 | 11/1999 |
| JP | 2000-223276 | 8/2000 |
| JP | 2000-315580 | 11/2000 |
| JP | 2000-315581 | 11/2000 |
| JP | 2000-349333 | 12/2000 |
| JP | 2001-076868 | 3/2001 |
| JP | 2001-185354 | 7/2001 |
| JP | 2001-244079 | 9/2001 |
| JP | 2002-015873 | 1/2002 |
| JP | 2002-332567 | 11/2002 |
| JP | 2002-367784 | 12/2002 |
| JP | 2003-229278 | 8/2003 |
| JP | 2003-272855 | 9/2003 |
| JP | 2003-272860 | 9/2003 |
| JP | 2004-006476 | 1/2004 |
| JP | 2004-134395 | 4/2004 |
| JP | 2004-514257 | 5/2004 |
| JP | 2004-349007 | 12/2004 |
| JP | 2005-026121 | 1/2005 |
| JP | 2005-032618 | 2/2005 |
| JP | 2005-123094 | 5/2005 |
| JP | 2005-123095 | 5/2005 |
| JP | 2005-166637 | 6/2005 |
| JP | 2005-251587 | 9/2005 |
| JP | 2006-024791 | 1/2006 |
| JP | 2008-258396 | 10/2008 |
| WO | WO 98/30071 | 7/1998 |
| WO | WO 00/01203 | 1/2000 |
| WO | WO 02/41414 | 5/2002 |
| WO | WO 2005/006460 | 1/2005 |

OTHER PUBLICATIONS

Written Opinion for PCT/JP2005/013516 dated Nov. 1, 2005.

Nakada et al., "Multi Photon Emission Organic EL Devices Using Charge-Transfer Complex as Charge Generation Layer," The 63$^{rd}$ Autumn Meeting, 27a-ZL-12, Sep. 24, 2002, p. 1165.

Tokito et al., "Metal Oxides as a Hole-Injecting Layer for an Organic Electroluminescent Device," J. Appl. Phys. (Journal of Applied Physics), 1996, vol. 29, pp. 2750-2753.

Search Report (Application No. PCT/JP2004/014412) dated Mar. 22, 2005.

Written Opinion (Application No. PCT/JP2004/014412) dated Mar. 22, 2005.

Search Report (Application No. PCT/JP2004/019466) dated Apr. 12, 2005.

Written Opinion (Application No. PCT/JP2004/019466) dated Apr. 12, 2005.

Office Action (Application No. 200480027991.7) dated Feb. 6, 2009.

Supplementary European Search Report (Application No. 05762042.9) dated Apr. 20, 2011.

Tokito et al., "Metal Oxides as a Hole-Injecting Layer for an Organic Electroluminescent Device," J. Phys. D: Appl. Phys. (Journal of Physics D: Applied Physics), 1996, vol. 29, pp. 2750-2753.

Taiwanese Office Action (Application No. 094124562) dated Dec. 28, 2011.

Liu.Z et al., "Efficient multilayer organic light emitting diode,", Synthetic Metals, May 1, 2001, vol. 122, No. 1, pp. 177-179.

European Office Action (Application No. 05762042.9) Dated Feb. 8, 2012.

\* cited by examiner

LIGHT EMITTING ELEMENT AND LIGHT EMITTING DEVICE USING THE SAME

TECHNICAL FIELD

The present invention relates to a light emitting element comprising a layer that includes a light emitting substance between a pair of electrodes, and in particular, relates to a structure of a light emitting element.

BACKGROUND ART

In recent year, many light emitting elements used for display devices and the like have a structure in which a layer that includes a light emitting substance is sandwiched between a pair of electrodes. Such a light emitting element emits light when an excited electron, which is formed by a recombination of an electron injected from one electrode and a hole injected from the other electrode, returns to a ground state.

Many of these light emitting elements have a problem in that the driving voltage is increased with the accumulation of light emitting time.

In order to solve this problem, for example, the patent document 1 discloses an organic EL element using a compound with a certain structure, wherein the increase in driving voltage, and the like are suppressed in driving the organic EL element.

[Patent Document 1]: International Patent Publication No. WO98/30071

DISCLOSURE OF INVENTION

It is an object of the present invention to provide a light emitting element having a slight increase in driving voltage with the accumulation of light emitting time. It is another object of the invention to provide a light emitting element having a slight increase in resistance value with the increase in film thickness.

In an aspect of the invention, a light emitting element includes a first layer, a second layer and a third layer between a first electrode and a second electrode that are provided to face each other. The first, second and third layers are laminated to one another while sandwiching the second layer between the first and third layers. The first layer is in contact with the first electrode and the third layer is in contact with the second electrode. The first layer generates holes while the second layer generates electrons. The third layer includes a light emitting substance. The second layer and the third layer are contacted to each other so as to inject electrons generated in the second layer into the third layer when applying the voltage to the light emitting element such that a potential of the second electrode is higher than that of the first electrode. By contacting the second layer to the third layer, the light emitting element emits light when being applied with a voltage such that a potential of the second electrode is higher than that of the first electrode.

In another aspect of the invention, a light emitting element includes a first layer, a second layer and a third layer between a first electrode and a second electrode that are provided to face each other. The first, second and third layers are laminated to one another while sandwiching the second layer between the first and third layers. The first layer is in contact with the first electrode and the third layer is in contact with the second electrode. The first layer includes a substance of which a hole transporting property is stronger than an electron transporting property, and a substance having an electron accepting property with respect to the substance of which the hole transporting property is stronger than the electron transporting property. The second layer includes a substance of which an electron transporting property is stronger than a hole transporting property, and a substance having an electron donating property with respect to the substance of which the electron transporting property is stronger than the hole transporting property. Also, the third layer includes a light emitting substance. The second and third layers are contacted to each other so as to inject electrons generated in the second layer into the third layer when applying the voltage to the light emitting element such that a potential of the second electrode is higher than that of the first electrode. By contacting the second layer to the third layer, the light emitting element emits light when being applied with the voltage such that the potential of the second electrode is higher than that of the first electrode.

In another aspect of the invention, a light emitting element includes a first layer, a second layer and a third layer between a first electrode and a second electrode that are provided to face each other. The first, second and third layers are laminated to one another while sandwiching the second layer between the first and third layers. The first layer is in contact with the first electrode and the third layer is in contact with the second electrode. The first layer includes a p-type semiconductor and the second layer includes an n-type semiconductor. The third layer includes a light emitting substance. The second and third layers are contacted to each other so as to inject electrons generated in the second layer into the third layer when applying the voltage to the light emitting element such that a potential of the second electrode is higher than that of the first electrode. By contacting the second layer to the third layer, the light emitting element emits light when being applied with the voltage such that the potential of the second electrode is higher than that of the first electrode.

In the above-described light emitting element of the invention, the layer containing the light emitting substance may have a single layer or multiple layers. When the layer containing the light emitting substance has multiple layers, the light emitting substance may be included at least in one layer of the multiple layers.

In another aspect of the invention, a light emitting element includes a first layer, a second layer and a third layer between a first electrode and a second electrode that are provided to face each other. The first, second and third layers are laminated to one another while sandwiching the second layer between the first and third layers. The first layer includes a substance of which a hole transporting property is stronger than an electron transporting property, and a substance having an electron accepting property with respect to the substance of which the hole transporting property is stronger than the electron transporting property. The second layer includes a substance of which an electron transporting property is stronger than a hole transporting property, and a substance having an electron donating property with respect to the substance of which the electron transporting property is stronger than the hole transporting property. The third layer has x pieces of layers (x is a given positive integer) including a light emitting layer. One layer included in the third layer is in contact with the second layer and the $x^{th}$ layer thereof is in contact with the second electrode. The first electrode includes a conductive material having high reflectance. There are y pieces of layers (y<x wherein y is a positive integer) between the light emitting layer of the third layer and the second layer. The second layer and the one layer of the third layer contacting to the second layer are in contact with each other so as to inject electrons generated in the second layer into the one layer of the third layer when applying the voltage to the light emitting element such that a potential of the second electrode is higher than that of the first electrode. By contacting the second layer to the one layer of the third layer, the light emitting element emits light when being applied with the voltage such that the potential of the second electrode is higher than that of the first electrode. Also, the thicknesses of the first and second layers are adjusted to satisfy the following expressions 1, 2 and 3:

$$n_i d_i + n_{ii} d_{ii} + \sum_{k=1}^{y} n_k d_k + n_j d_j = \frac{(2m-1)\lambda}{4} \qquad 1$$

$$0 \leq d_j \leq d_{emi} \qquad 2$$

$$d_i \geq d_{ii} \qquad 3$$

In the expressions 1, 2 and 3, $n_i$ indicates the refractive index of the first layer; $d_i$, the thickness of the first layer; $n_{ii}$, the refractive index of the second layer; $d_{ii}$, the thickness of the second layer; $n_k$, the refractive index of the $k^{th}$ layer of the layers sandwiched between the light emitting layer and the second layer; $d_k$, the thickness of the $k^{th}$ layer of the layers sandwiched between the light emitting layer and the second layer; $n_j$, the refractive index of the light emitting layer; $d_j$, a distance between a first-electrode-side surface of the light emitting layer and a light emitting region; $\lambda$, a wavelength of light emission from the light emitting element; m, a given positive integer; and $d_{emi}$, the thickness of the light emitting layer.

According to the present invention, a highly reliable light emitting element having slight increase in driving voltage with the accumulation of light emitting time can be obtained.

In addition, a light emitting element having slight increase in resistance value that is dependent on the thickness of a layer generating holes can be obtained according to the invention. As a result, a light emitting element in which a distance between electrodes can be changed easily can be obtained. Also, by increasing the distance between the electrodes, the short-circuiting between the electrodes can be prevented. Additionally, by controlling the distance between the electrodes, an optical distance can be easily controlled such that the light extraction efficiency can be increased to a maximal value. In addition, by controlling the distance between the electrodes, an optical distance can be controlled easily so that the variation in emission spectrum depending on an angle of seeing a light emitting surface is reduced.

Furthermore, by applying a light emitting element obtained according to the present invention to a light emitting device, a highly reliable light emitting device that can withstand long-time use can be obtained. Moreover, by applying the light emitting element obtained according to the invention to a light emitting device having a display function, it is possible to obtain a light emitting device capable of displaying high-definition images with slight variation in the emission spectrum that depends on an angle of seeing a light emitting surface, wherein light can be emitted to the outside efficiently.

BEST MODE FOR CARRYING OUT THE INVENTION

The embodiment modes according to the present invention will hereinafter be described referring to the accompanying drawings. It is easily understood by those who skilled in the art that the embodiment modes and details herein disclosed can be modified in various ways without departing from the purpose and the scope of the invention. The present invention should not be interpreted as being limited to the description of the embodiment modes to be given below.

Embodiment Mode 1

Figure 1:
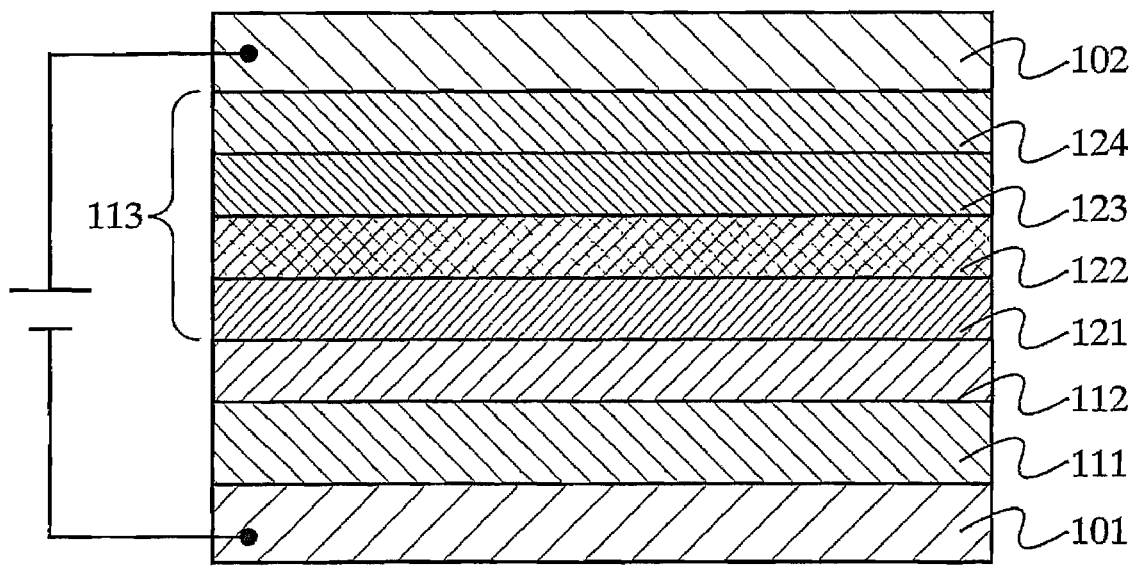
FIG. 1 is a view showing a laminated structure of a light emitting element according to the present invention.

One embodiment mode of the present invention will be described with reference to a cross sectional view of a light emitting element as shown in FIG. 1.

The light emitting element includes a first layer 111, a second layer 112 and a third layer 113 between a first electrode 101 and a second electrode 102. The first, second and third layers are laminated to one another. The first layer 111 is in contact with the first electrode 101 and the third layer 113 is in contact with the second electrode 102.

The light emitting element of the present embodiment mode is operated as follows. When the voltage is applied to the light emitting element such that a potential of the second electrode 102 is higher than that of the first electrode 101, holes are injected into the first electrode 101 from the first layer 111 while electrons are injected to the third layer 113 from the second layer 112. Also, holes are injected to the third layer 113 from the second electrode 102. The holes injected from the second electrode 102 and the electrons injected from the second layer 112 are recombined in the third layer 113 so that a light emitting substance is excited. The light emitting substance emits light when returning to a ground state from the excited state.

Thereinafter, the various layers, electrodes and the like will be described in more detail below.

The first layer 111 generates holes. As the first layer 111, for example, a layer containing a substance with a hole transporting property and a substance having an electron accepting property with respect to the substance with the hole transporting property can be given. The substance with the hole transporting property indicates a substance of which a transporting property is stronger than an electron transporting property. The substance with the hole transporting property is not particularly limited. For example, an aromatic amine compound such as 4,4'-bis(N-[1-naphthyl]-N-phenylamino) biphenyl (abbreviation: NPB), 4,4'-bis(N-[3-methylphenyl]-N-phenylamino)biphenyl (abbreviation: TPD), 4,4',4''-tris(N,N-diphenylamino)triphenylamine (abbreviation: TDATA), 4,4', 4''-tris(N-[3-methylphenyl]-N-phenylamino)triphenylamine (abbreviation: MTDATA), and 4,4'-bis(N-(4-[N,N-di-m-tolylamino]phenyl)-N-phenylamino)biphenyl (abbreviation: DNTPD); a phthalocyanine compound such as phthalocyanine (abbreviation: $H_2Pc$), copper phthalocyanine (abbreviation: CuPc) and vanadyl phthalocyanine (abbreviation: VOPc) can be used. Also, the substance having the electron accepting property with respect to the substance with the hole transporting property is not particularly limited. For example, molybdenum oxide, vanadium oxide, 7,7,8,8-tetracyanoquinodimethane (abbreviation: TCNQ), 2,3,5,6-tetrafluoro-7,7,8,8-tetracyanoquinodimethane (abbreviation: F4-TCNQ), and the like can be used. The first layer 111 preferably includes the substance having the electron accepting property with respect to the substance with the hole transporting property so as to satisfy a molar ratio (i.e., the substance having the electron accepting property with respect to the substance with the hole transporting property/the substance with the hole transporting property) of 0.5 to 2. In addition, the first layer 111 may include a p-type semiconductor such as molybdenum oxide, vanadium oxide, ruthenium oxide, cobalt oxide and copper oxide.

The second layer 112 generates electrons. As the second layer 112, for example, a layer including a substance with an electron transporting property and a substance having an electron donating property with respect to the substance with the electron transporting property can be given. The substance with the electron transporting property is a substance of which an electron transporting property is stronger than a hole transporting property. The substance with the electron transporting property is not particularly limited. For example, a metal complex such as tris(8-quinolinolato)aluminum (abbreviation: $Alq_3$), tris(4-methyl-8-quinolinolato)aluminum (abbreviation: $Almq_3$), bis(10-hydroxybenzo[h]quinolinato)beryllium (abbreviation: $BeBq_2$), bis(2-methyl-8-quinolinolato)-4-phenylphenolate-aluminum (abbreviation: BAlq), bis (2-[2-hydroxyphenyl]benzoxazolate)zinc (abbreviation: $Zn(BOX)_2$), bis(2-[2-hydroxyphenyl]benzothiazolate)zinc (abbreviation: $Zn(BTZ)_2$) can be used. In addition, the following substances can be used as the substance with the electron transporting property: 2-(4-biphenylyl)-5-(4-tert-butylphenyl)-1,3,4-oxadiazole (abbreviation; PBD); 1,3-bis (5-[p-tert-butylphenyl]-1,3,4-oxadiazole-2-yl)benzene (abbreviation: OXD-7); 3-(4-tert-butylphenyl)-4-phenyl-5-(4-biphenylyl)-1,2,4-triazole (abbreviation: TAZ); 3-(4-tert-butylphenyl)-4-(4-ethylphenyl)-5-(4-biphenylyl)-1,2,4-triazole (abbreviation: p-EtTAZ); bathophenanthroline (abbreviation: BPhen); bathocuproin (abbreviation: BCP); and the like. Further, the substance having the electron donating property with respect to the substance with the electron transporting property is not particularly limited. For example, alkali metal such as lithium and cesium, alkali earth metal such as magnesium and calcium, rare-earth metal such as erbium and ytterbium, and the like can be used as the substance having the electron donating property with respect to the substance with the electron transporting property. Preferably, the second layer 112 includes the substance having the electron donating property with respect to the substance with the electron transporting property and the electron transporting property so as to satisfy a molar ratio (i.e., the substance having the electron donating property with respect to the substance with the electron transporting property/the substance with the electron transporting property) of 0.5 to 2. Additionally, the second layer 112 may include an n-type semiconductor such as zinc oxide, zinc sulfide, zinc selenide, tin oxide and titanium oxide.

The third layer 113 contains a light emitting layer. The layer structure of the third layer 113 is not particularly limited. The third layer 113 may include either a single layer or multiple layers. For example, as shown in FIG. 1, the third layer 113 may include an electron transporting layer 121, a hole transporting layer 123 and a hole injecting layer 124 along with the light emitting layer 122. Alternatively, the third layer 113 may include only the light emitting layer.

The light emitting layer 122 contains a light emitting substance. The light emitting substance indicates a substance that can emit light with a desired wavelength and has an excellent light emitting efficiency. The third layer 113 is not particularly limited. The third layer 113 is preferably formed using a layer in which a light emitting substance is dispersed and which is made from a substance having a larger energy gap than that of the light emitting substance. Accordingly, light emitted from the light emitting substance can be prevented from going out due to the concentration of the light emitting substance. Further, the energy gap indicates an energy gap between the LUMO level and the HOMO level.

The light emitting substance is not particularly limited. A substance capable of emitting light with a desired wavelength and having an excellent light emitting efficiency may be used.

In order to obtain red light emission, for example, the following substances exhibiting emission spectrum with peaks at 600 to 680 nm can be employed: 4-dicyanomethylene-2-isopropyl-6-(2-[1,1,7,7-tetramethyljulolidine-9-yl]ethenyl)-4H-pyran (abbreviation: DCJTI); 4-dicyanomethylene-2-methyl-6-(2-[1,1,7,7-tetramethyljulolidine-9-yl]ethenyl)-4H-pyran (abbreviation: DCJT); 4-dicyanomethylene-2-tert-butyl-6-(2-[1,1,7,7-tetramethyljulolidine-9-yl]ethenyl)-4H-pyran (abbreviation: DCJTB); periflanthene; 2,5-dicyano-1,4-bis(2-[10-methoxy-1,1,7,7-tetramethyljulolidine-9-yl]ethenylbenzene and the like. In order to obtain green light emission, substances exhibiting emission spectrum with peaks at 500 to 550 nm such as N,N'-dimethylquinacridon (abbreviation: DMQd), coumarin 6, coumarin 545T, and tris(8-quinolinolate)aluminum (abbreviation: $Alq_3$) can be employed. In order to obtain blue light emission, the following substances exhibiting emission spectrum with peaks at 420 to 500 nm can be employed: 9,10-bis(2-naphthyl)-tert-butylanthracene (abbreviation: t-BuDNA); 9,9'-bianthryl; 9,10-diphenylanthracene (abbreviation: DPA); 9,10-bis(2-naphthyl)anthracene (abbreviation: DNA); bis(2-methyl-8-quinolinolate)-4-phenylphenolate-gallium (abbreviation: BGaq); bis(2-methyl-8-quinolinolate)-4-phenylphenolate-aluminum (abbreviation: BAlq); and the like.

A substance used for dispersing a light emitting substance is not particularly limited. For example, an anthracene derivative such as 9,10-di(2-naphthyl)-2-tert-butylanthracene (abbreviation: t-BuDNA), a carbazole derivative such as 4,4'-bis(N-carbazolyl)biphenyl (abbreviation: CBP), a metal complex such as bis(2-[2-hydroxyphenyl]pyridinato)zinc (abbreviation: $Znpp_2$) and bis(2-[2-hydroxyphenyl]benzoxazolato)zinc (abbreviation: ZnBOX), and the like can be used.

In the above-described light emitting element, the difference in electron affinity between the substance with the electron transporting property, which is included in the second layer 112 and a substance, which is included in one layer contacting to the second layer 112 among the layers included in the third layer 113, is preferably set to be 2 eV or less, more preferably, 1.5 eV or less. When the second layer 112 is made by using an n-type semiconductor, the difference between a work function of the n-type semiconductor and the electron affinity of the substance, which is included in the layer contacting to the second layer 112 among the layers included in the third layer 113, is preferably set to be 2 eV or less, more preferably, 1.5 eV or less.

Further, the layer contacting to the second layer 112 among the layers included in the third layer 113 corresponds to the electron transporting layer 121 in the case where the third layer 113 comprises the structure of the present embodiment mode. When the third layer 113 includes only the light emitting layer, or, when the third layer 113 does not include the electron transporting layer 121 or the like, the light emitting layer corresponds to this layer contacting to the second layer 112. In the case where the light emitting layer is in contact with the second layer 112, a substance that is included in the layer contacting to the second layer 112 among the layers included in the third layer 113 corresponds to a substance for dispersing the light emitting substance or the light emitting substance itself. This is because, with respect to a light emitting substance like $Alq_3$ that can emit light without being dispersed in the substance for dispersing the light-emitting substance and has an excellent carrier transporting property, a layer made from only the light emitting substance can function as a light emitting layer without dispersing the light emitting substance in the substance for dispersing the light-emitting substance. Therefore, by contacting the third layer 113 to the second layer 112, electrons can easily be injected into the third layer 113 from the second layer 112.

Preferably, one or both of the first electrode 101 and the second electrode 102 is/are formed by using a conductive substance capable of transmitting visible light. Accordingly, light generated in the light emitting layer can be emitted to the outside through at least one of the first electrode 101 and the second electrode 102.

The first electrode 101 is not particularly limited. For example, aluminum, indium tin oxide (ITO), indium tin oxide containing silicon oxide, indium oxide containing 2 to 20% zinc oxide can be used as the first electrode. Additionally, gold (Au), platinum (Pt), nickel (Ni), tungsten (W), chromium (Cr), molybdenum (Mo), iron (Fe), cobalt (Co), copper (Cu), palladium (Pd) and the like can be used.

Also, the second electrode 102 is not particularly limited. When the second electrode 102 has a function of injecting holes to the third layer 113 like the light emitting element of the present embodiment mode, the second electrode 102 is preferably made from a substance having a large work function. Concretely, indium tin oxide (ITO), indium tin oxide containing silicon oxide, indium oxide containing 2 to 20% zinc oxide, gold (Au), platinum (Pt), nickel (Ni), tungsten (W), chromium (Cr), molybdenum (Mo), iron (Fe), cobalt (Co), copper (Cu), palladium (Pd) and the like can be used. Further, for instance, the second electrode 102 can be formed by sputtering, evaporation, or the like.

As described above, the electron transporting layer 121 is sandwiched between the second layer 112 and the light emitting layer 122 in the present embodiment mode. The electron transporting layer 121 has a function of transporting electrons injected therein to the light emitting layer 122. By providing the electron transporting layer 121 therebetween to isolate the first electrode 101 and the second layer 112 containing metal from the light emitting layer 122, light generated in the light emitting layer can be prevented from going out due to the metal.

The electron transporting layer 121 is not particularly limited and can be formed by using the above-described $Alq_3$, $Almq_3$, $BeBq_2$, BAlq, $Zn(BOX)_2$, $Zn(BTZ)_2$, PBD, OXD-7, TAZ, p-EtTAZ, BPhen, BCP, or the like. The electron transporting layer 121 is preferably formed by using the above-mentioned substance with an electron transporting property of which the electron mobility is higher than the hole mobility. Also, the electron transporting layer 121 is preferably formed by using a substance having the electron mobility of $10^{-6}$ cm$^2$/Vs or more. Further, the electron transporting layer 121 may have a multilayer structure formed by laminating two or more layers made from the above-described substances.

In this embodiment mode, a hole transporting layer 123 is provided between the second electrode 102 and the light emitting layer 122 as shown in FIG. 1. The hole transporting layer 123 has a function of transporting the holes injected from the second electrode 102 to the light emitting layer 122. By providing the hole transporting layer 123 to isolate the second electrode 102 from the light emitting layer 122, light generated in the light emitting layer can be prevented from going out due to the metal.

The hole transporting layer 123 is not particularly limited. The above-described NPB, TPD, TDATA, MTDATA, DNTPD and the like can be used as the hole transporting layer. Preferably, the hole transporting layer 123 is formed by using the above-described substance with a hole transporting property of which the hole mobility is higher than the electron mobility. Also, the hole transporting layer 123 is preferably formed using a substance having the hole mobility of $10^{-6}$ cm²/Vs or more. The hole transporting layer 123 may have a multilayer structure formed by laminating two or more layers made from the above-described substances.

As shown in FIG. 1, the hole injecting layer 124 may be provided between the second electrode 102 and the hole transporting layer 123. The hole injecting layer 124 has a function of helping the injection of holes into the hole transporting layer 123 from the second electrode 102.

The hole injecting layer 124 is not particularly limited. The hole injecting layer can be formed by using metal oxide such as molybdenum oxide, vanadium oxide, ruthenium oxide, tungsten oxide and manganese oxide. In addition, the hole injecting layer 124 can be formed by using the above-described phthalocyanine compound such as $H_2Pc$, CuPC and VOPc, the aromatic amine compound such as DNTPD, or a high molecular weight material such as a poly(ethylenedioxythiophene)/poly(styrene sulfonate) mixture (PEDOT/PSS). Furthermore, the hole injecting layer 124 may be formed using the above-described layer including the substance with the hole transporting property and the substance having the electron accepting property with respect to the substance with the hole transporting property.

The above-described light emitting element of the present invention is a highly-reliable light emitting element in which the driving voltage is slightly increased with the accumulation of light emitting time. Further, the voltage applied to obtain the predetermined luminance is referred to as the driving voltage here.

The light emitting element of the present invention has slight change in voltage, which is applied to the light emitting element to flow the predetermined current through the light emitting element, depending on the thickness of the layer generating the holes (i.e., the first layer 111). Therefore, for example, by increasing the thickness of the first layer 111 to increase the distance between the first and second electrodes, the first electrode 101 can be easily prevented from short-circuiting with the second electrode 102.

Embodiment Mode 2

Figure 24:
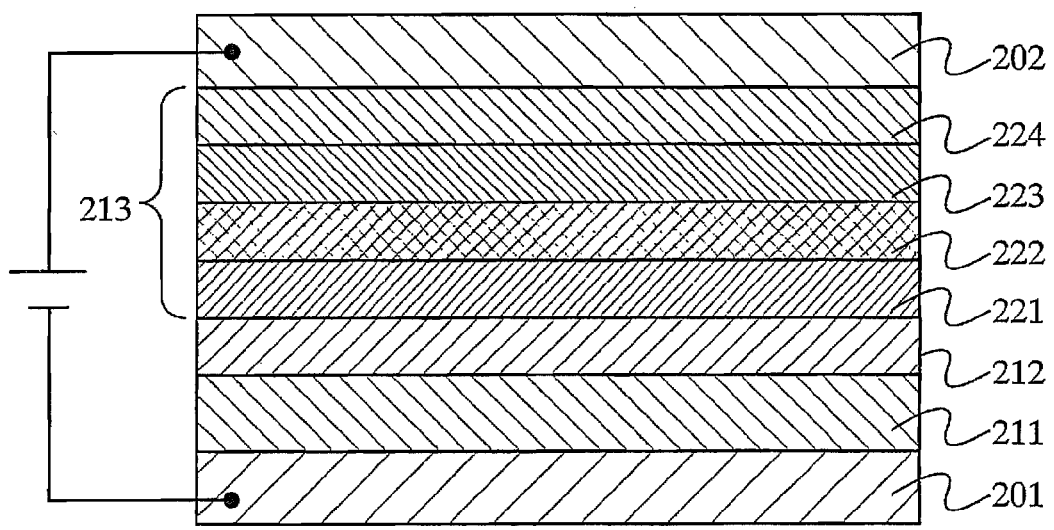
FIG. 24 is a view showing a laminated structure of a light emitting element according to the invention.

This embodiment mode will describe a light emitting element in which a light extraction efficiency is increased by controlling the thickness of a layer generating holes and an optical distance between an reflecting surface and a light emitting region is controlled to reduce the change in emission spectrum depending on an angle of seeing the light emitting surface, with reference to FIG. 24.

A light emitting element of FIG. 24 comprises a first layer 211 generating holes, a second layer 212 generating electrons, and a third layer 213 containing a light emitting substance between a first electrode 201 and a second electrode 202. The first layer 211, the second layer 212 and the third layer 213 are laminated to one another while sandwiching the second layer 212 between the first and third layers. The first layer 211 is in contact with the first electrode 201 while the third layer 213 is in contact with the second electrode 202.

The first electrode 201 is an electrode made from a conductive material having high reflectance, or, a reflecting electrode. As the conductive material having the high reflectance, aluminum, silver, an alloy of these metals (e.g., an Al:Li alloy, an Mg:Ag alloy etc.) and the like can be used. The conductive material preferably has the reflectance of 50 to 100%. The second electrode 202 is made from a conductive material that can transmit visible light. The conductive material that can transmit visible light is not particularly limited, and indium tin oxide, indium tin oxide containing silicon oxide, indium oxide containing 2 to 20% zinc oxide, or the like can be used.

When applying the voltage to the light emitting element such that a potential of the second electrode 202 is higher than that of the first electrode 201, holes are injected into the first electrode 201 from the first layer 211 while electrons are injected into the third layer 213 from the second layer 212. Also, holes are injected into the third layer 213 from the second electrode 202.

The electrons and holes are recombined in the third layer 213 so that a light emitting substance is excited. The light emitting substance emits light upon retuning to the ground state from the excited state. A region in which light is generated in this way is particularly referred to as a light emitting region. A layer including a light emitting substance for forming the light emitting region is referred to as a light emitting layer. Further, the light emitting region is formed at least in a part of the light emitting layer.

In the light emitting element according to the present embodiment mode, the third layer 213 includes an electron transporting layer 221, a hole transporting layer 223 and a hole injecting layer 224, along with the light emitting layer 222. Further, the structure of the third layer 213 is not limited to the one shown in FIG. 24. For instance, the third layer 213 may have a single layer structure including only the light emitting layer.

The first layer 211, the second layer 212 and the third layer 213 may be formed by using the same materials of the first layer 111, the second layer 112 and the third layer 113 as described in Embodiment Mode 1, respectively. Similarly, the electron transporting layer 221, the light emitting layer 222, the hole transporting layer 223 and the hole injecting layer 224 may be formed by using the same materials of the electron transporting layer 121, the light emitting layer 122, the hole transporting layer 123 and the hole injecting layer 124 as described in Embodiment Mode 1, respectively.

When light entering into the reflecting electrode, a phase inversion is caused in the reflected light. By the effect of interference of light due to the phase inversion, when an optical distance between the light emitting region and the reflecting electrode (i.e., reflectance x distance) is (2m−1)/4 times (m is a given positive integer) of the emission wavelength, or, when the optical distance is 1/4, 3/4, 5/4 times of the emission wavelength, the light extraction efficiency is increased. Meanwhile, when the optical distance therebetween is m/2 times (m is a given positive integer), or, 1/2, 1, 3/2 . . . times of the emission wavelength, the light extraction efficiency is reduced.

Therefore, in the case where the light emitting region is placed in the vicinity of an interface between the light emitting layer 222 and the hole transporting layer 223 in the light emitting element according to the present embodiment mode, the respective thicknesses of the first layer 211, the second layer 212, the electron transporting layer 221 and the light emitting layer 222 are preferably adjusted so as to satisfy the following expression 4. Accordingly, light can be emitted to the outside efficiently. Also, the increase in resistance value with the increase of film thicknesses of $d_i$ and $d_{ii}$ can be suppressed. Here the resistance value indicates a value obtained by dividing the applied voltage (V) by the current (mA) flowing through the light emitting element according to the applied voltage.

$$n_i d_i + n_{ii} d_{ii} + n_1 d_1 + n_p d_p = \frac{(2m-1)\lambda}{4} \qquad 4$$

In the expression 4, $n_i$ represents the refractive index of the first layer 211; $d_i$, the thickness of the first layer 211; $n_{ii}$, the refractive index of the second layer 212; the thickness of the second layer 212; $n_t$, the refractive index of the electron transporting layer 221; $d_t$, the thickness of the electron transporting layer 221; $n_p$, the refractive index of the light emitting layer 222; $d_p$, the thickness of the light emitting layer 222; $\lambda$, the wavelength of light generated in the light emitting element; and m, a given positive integer.

Meanwhile, in the case where the light emitting region is placed in the vicinity of an interface between the light emitting layer 222 and the electron transporting layer 221 in the light emitting element of the present embodiment mode, the respective thicknesses of the first layer 211, the second layer 212 and the electron transporting layer 221 are preferably adjusted so as to satisfy the expression 5. Accordingly, light can be emitted to the outside portion efficiently. In addition, the increase in the resistance value with the increase in film thicknesses of $d_t$ and $d_{ii}$ can be suppressed.

$$n_i d_i + n_{ii} d_{ii} + n_1 d_1 = \frac{(2m-1)\lambda}{4} \qquad 5$$

In the expression 5, $n_i$ represents the refractive index of the first layer 211; $d_i$, the thickness of the first layer 211; $n_{ii}$, the refractive index of the second layer 212; the thickness of the second layer 212; $n_t$, the refractive index of the electron transporting layer 221; $d_t$, the thickness of the electron transporting layer 221; $\lambda$, the wavelength of light generated in the light emitting element; and m, a given positive integer.

Further, when the light emitting region is formed in the entire area of the light emitting layer 222 in the light emitting element of this embodiment mode, the respective thicknesses of the first layer 211, the second layer 212 and the electron transporting layer 221 are preferably adjusted so as to satisfy the following expression 6. Accordingly, light can be emitted to the outside efficiently.

$$\frac{(2m-1)\lambda}{4} - n_{ii}d_{ii} - n_1 d_1 - n_p d_p \leq n_i d_i \leq \frac{(2m-1)\lambda}{4} - n_{ii}d_{ii} - n_1 d_1 \qquad 6$$

In the expression 6, $n_i$ represents the refractive index of the first layer 211; $d_i$, the thickness of the first layer 211; $n_{ii}$, the refractive index of the second layer 212; the thickness of the second layer 212; $n_t$, the refractive index of the electron transporting layer 221; $d_t$, the thickness of the electron transporting layer 221; $n_p$, the refractive index of the light emitting layer 222; $d_p$, the thickness of the light emitting layer 222; $\lambda$, the wavelength of light generated in the light emitting element; and m, a given positive integer.

In the expressions 4, 5 and 6, in preferably satisfies the relation of $1 \leq m \leq 10$. Concretely, the light generated in the light emitting element indicates light emitted from the light emitting substance to the outside of the light emitting element. Also, the wavelength of light emission indicates a theoretical figure with respect to a wavelength showing a maximal value in emission spectrum.

When the first layer 211 is formed using a substance with a hole transporting property and the second layer 212 is formed using a substance with an electron transporting property, in particular, $d_{ii}$ is preferably equal to or greater than $d_i$ in the above-mentioned expressions 4, 5 and 6. Accordingly, the increase in the resistance value with the increase in film thickness can be further suppressed. This is because, in particular, a large amount of substance with the hole transporting property exists relative to the substance with the electron transporting property in organic materials, and the substance with the hole transporting property that has higher hole mobility is easily 6512, a writing gate signal line driver circuit 6513 and an erasing gate signal line driver circuit 6514 are provided over a substrate 6500. The source signal line driver circuit 6512, the writing gate signal line driver circuit 6513 and the erasing gate signal line driver circuit 6514 are connected to FPCs (flexible printed circuits) 6503, which are external input terminals, through wiring groups, respectively. The source signal line driver circuit 6512, the writing gate signal line driver circuit 6513 and the erasing gate signal line driver circuit 6514 receive video signals, clock signals, start signals, reset signals and the like from the FPCs 6503, respectively. The FPCs 6503 are attached with printed wiring boards (PWBs) 6504. Further, driver circuits are not necessary to be formed over the same substrate as the pixel portion 6511. For example, the driver circuits may be provided outside of the substrate by utilizing TCP in which an IC chip is mounted over an FPC having a wiring pattern, or the like.

A plurality of source signal lines extending in columns are aligned in rows in the pixel portion 6511. Also, power supply lines are aligned in rows. A plurality of gate signal lines extending in rows are aligned in columns in the pixel portion 6511. In addition, a plurality of circuits each including a light emitting element are aligned in the pixel portion 6511.

Figure 4:
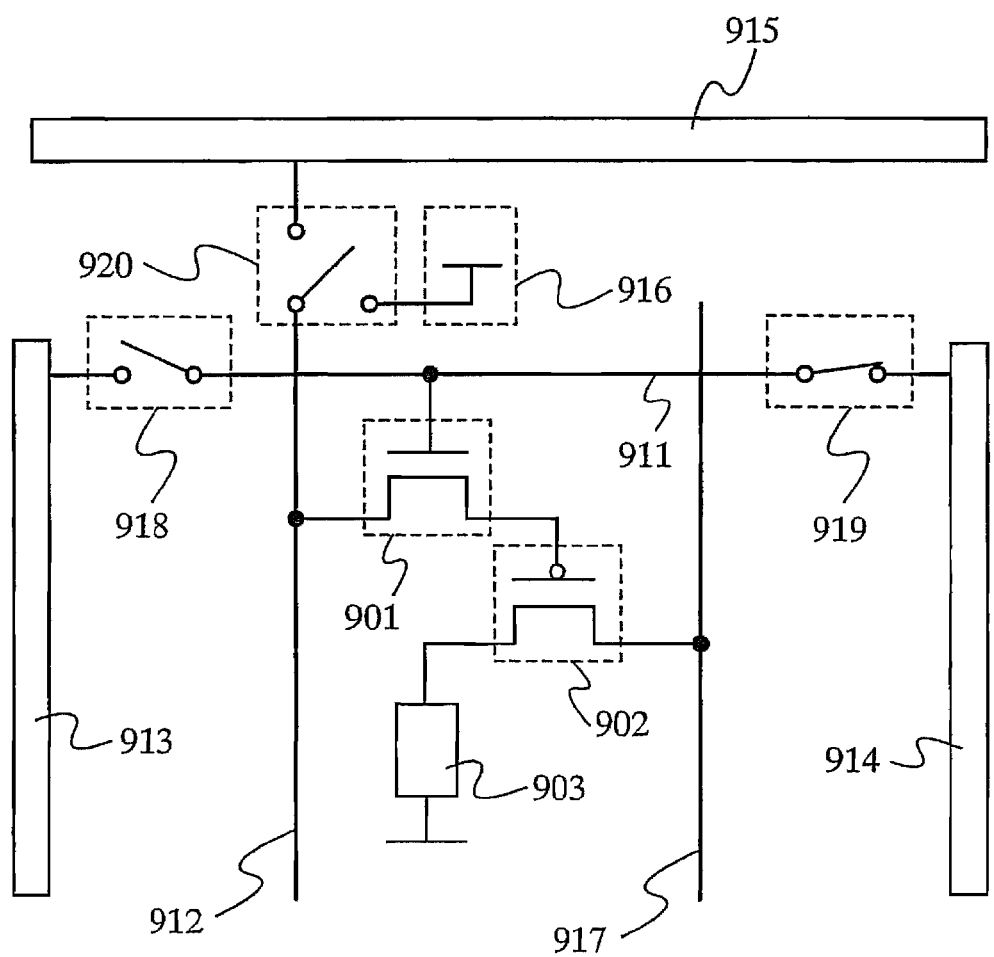
FIG. 4 is a diagram explaining a circuit included in a light emitting device according to the invention.

FIG. 4 is a diagram showing a circuit for operating one pixel. The circuit as shown in FIG. 4 comprises a first transistor 901, a second transistor 902 and a light emitting element 903.

Each of the first and second transistors 901 and 902 is a three terminal element including a gate electrode, a drain region and a source region. A channel region is interposed between the drain region and the source region. The region serving as the source region and the region serving as the drain region are changed depending on a structure of a transistor, an operational condition and the like, and therefore, it is difficult to determine which regions serve as the source region and the drain region. Accordingly, the regions serving as the source and the drain are denoted as a first electrode and a second electrode of each transistor in this embodiment mode, respectively.

A gate signal line 911 and a writing gate signal line driver circuit 913 are obtained as compared with the substance with the electron transporting property that has the higher electron mobility. Therefore, the light emitting element of the present invention can utilize the substance with the hole transporting property effectively. By utilizing the substance with the hole transporting property effectively, the range of choices for materials that are used for forming the light emitting element is widened, and hence, the light emitting element can be formed easily.

The light emitting element having the structure in which the electron transporting layer 221 is sandwiched between the second layer 212 and the light emitting layer 222 is explained in this embodiment mode. Alternatively, the light emitting element may include a different layer between the second layer 212 and the light emitting layer 222, rather than the electron transporting layer 221. In this case, $n_1 d_1$ in the expression 6 can be expressed as follows: $n_1 d_1 + n_2 d_2 \ldots + n_k d_k + \ldots$.

Embodiment Mode 3

The light emitting element according to the present invention is a highly reliable element having slight increase in the driving voltage with the accumulation of light emitting time. By applying the light emitting element according to the invention to, e.g., a pixel portion, a light emitting device having low power consumption can be obtained. Also, the light emitting element of the invention can prevent the short-circuiting between electrodes easily. Therefore, by applying the light emitting element of the invention to a pixel portion, a light emitting device capable of displaying favorable images having less defects due to the short-circuiting can be obtained. Furthermore, the light emitting element according to the invention can easily emit light to the outside. By applying the light emitting element of the invention to a pixel portion, a light emitting device capable of performing display operation at low power consumption can be obtained.

In this embodiment mode, circuit structures and driving methods of a light emitting device having a display function will be described with reference to FIGS. 3, 4, 5 and 6.

Figure 3:
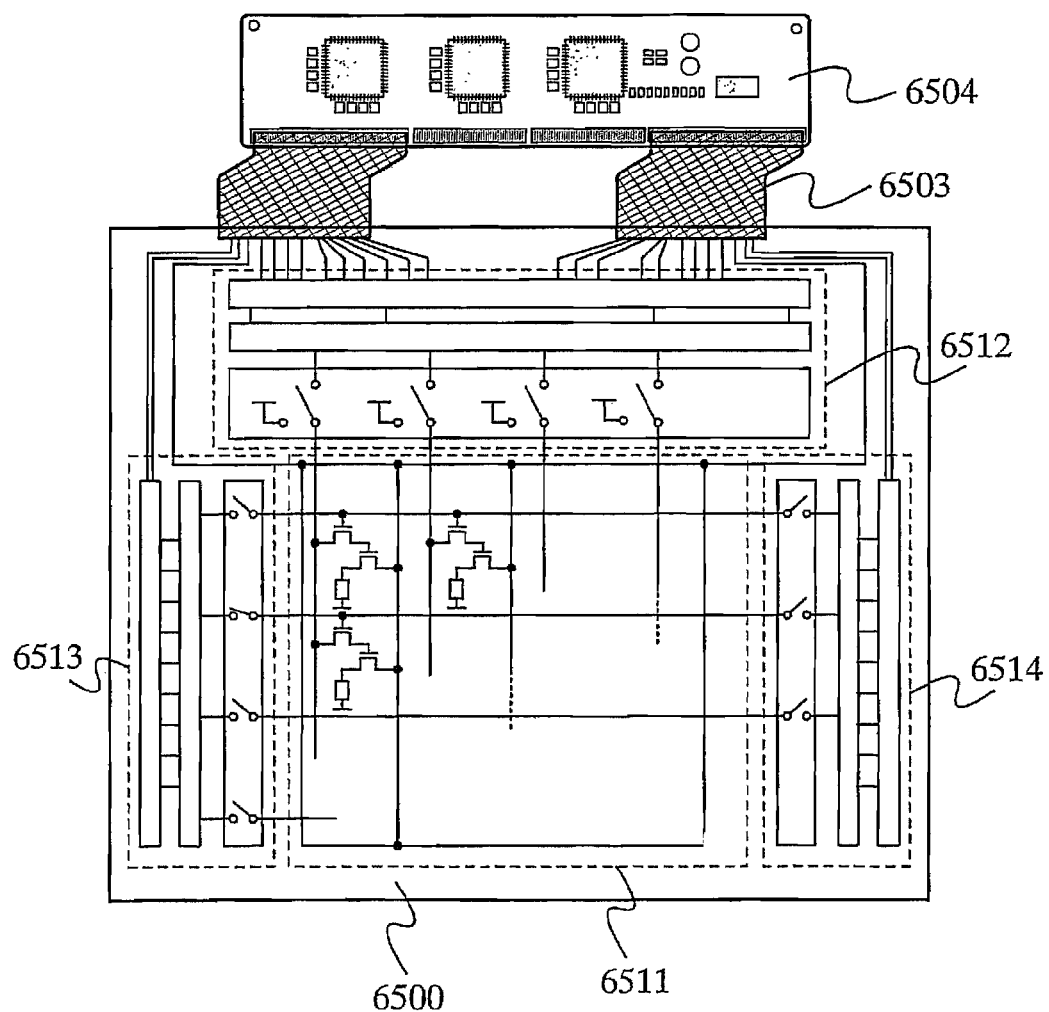
FIG. 3 is a view explaining a light emitting device according to the invention.

FIG. 3 is a schematic top view of a light emitting device according to the present invention. In FIG. 3, a pixel portion 6511, a source signal line driver circuit provided to be electrically connected or disconnected to each other by a switch 918. The gate signal line 911 and an erasing gate signal line driver circuit 914 are provided to be electrically connected or disconnected to each other by a switch 919. A source signal line 912 is provided to be electrically connected to either a source signal line driver circuit 915 or a power source 916 by a switch 920. A gate of the first transistor 901 is electrically connected to the gate signal line 911. The first electrode of the first transistor 901 is electrically connected to the source signal line 912 while the second electrode thereof is electrically connected to a gate electrode of the second transistor 902. The first electrode of the second transistor 902 is electrically connected to a current supply line 917 while the second electrode thereof is electrically connected to one electrode included in a light emitting element 903. Further, the switch 918 may be included in the writing gate signal line driver circuit 913. The switch 919 may also be included in the erasing gate signal line driver circuit 914. In addition, the switch 920 may be included in the source signal line driver circuit 915.

Figure 5:
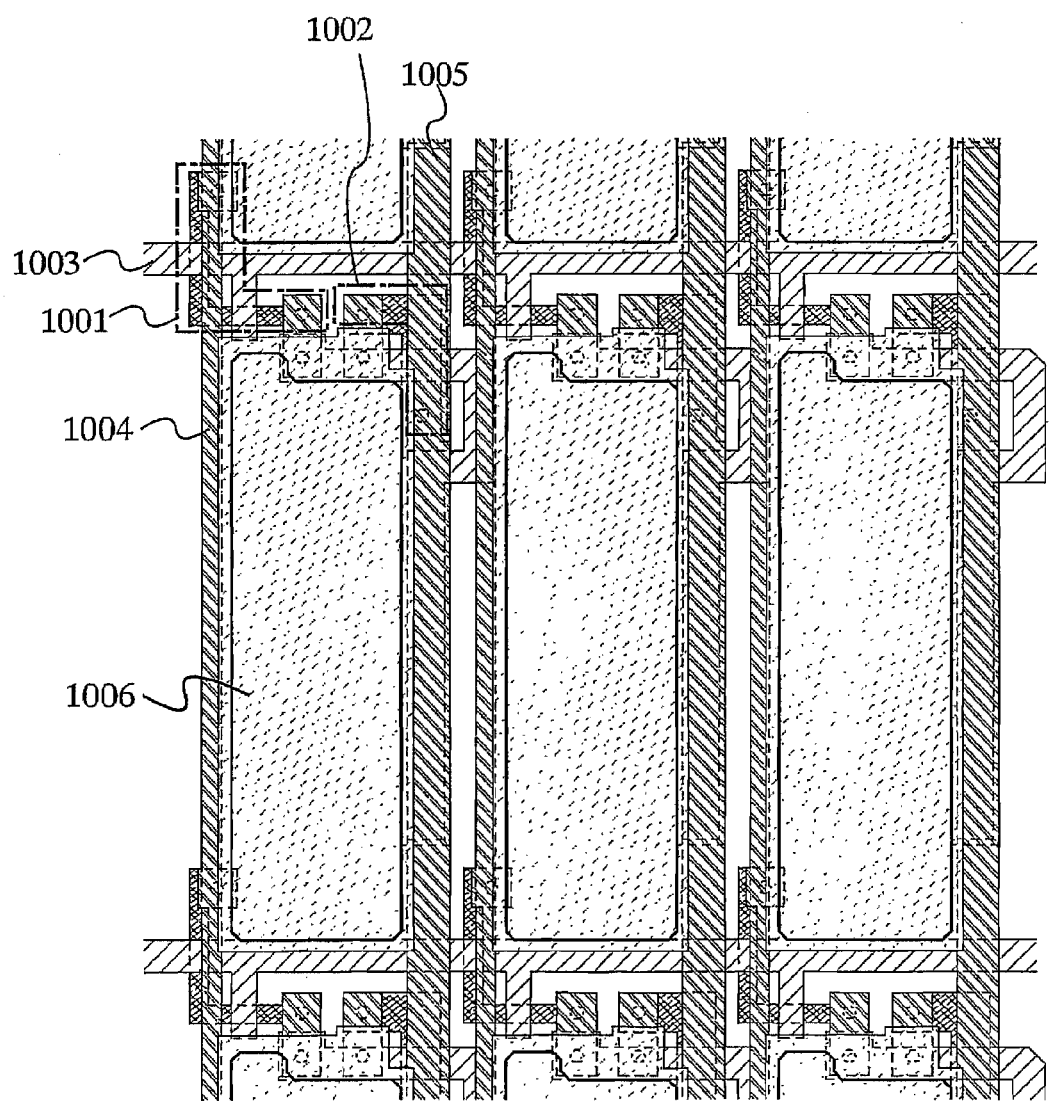
FIG. 5 is a top view of a light emitting device according to the invention.

The arrangement of transistors, light emitting elements and the like in the pixel portion is not particularly limited. For example, the arrangement as shown in a top view of FIG. 5 can be employed. In FIG. 5, a first electrode of a first transistor 1001 is connected to a source signal line 1004 while a second electrode of the first transistor is connected to a gate electrode of a second transistor 1002. A first electrode of the second transistor 1002 is connected to a current supply line 1005 and a second electrode of the second transistor is connected to an electrode 1006 of a light emitting element. A part of the gate signal line 1003 functions as a gate electrode of the first transistor 1001.

Figure 6:
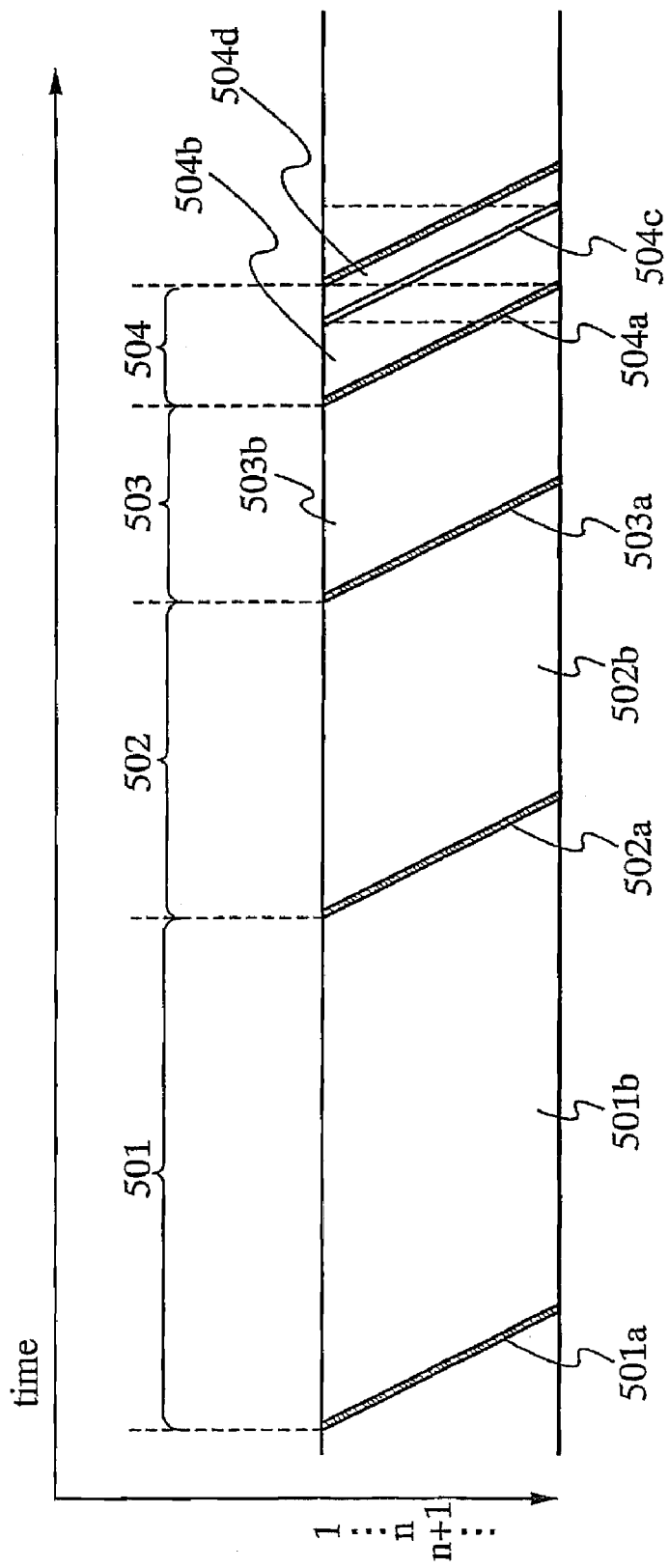
FIG. 6 is a diagram explaining a frame operation of a light emitting device according to the invention.

Next, the method for driving the light emitting device will be described below. FIG. 6 is a diagram explaining an operation of a frame with time. In FIG. 6, a horizontal direction indicates time passage while a longitudinal direction indicates the number of scanning stages of a gate signal line.

When an image is displayed on the light emitting device according to the invention, a rewriting operation and a displaying operation are carried out during a display period, repeatedly. The number of rewriting operations is not particularly limited. However, the rewriting operation is preferably performed about 60 times a second such that a person who watches a displayed image does not detect flicker in the image. A period of operating the rewriting operation and the displaying operation of one image (one frame) is, herein, referred to as one frame period.

As shown in FIG. 6, one frame is divided into four sub-frames 501, 502, 503 and 504 including writing periods 501$a$, 502$a$, 503$a$ and 504$a$ and holding periods 501$b$, 502$b$, 503$b$ and 504$b$. The light emitting element applied with a signal for emitting light emits light during the holding periods. The length ratio of the holding periods in each of the first sub-frame 501, the second sub-frame 502, the third sub-frame 503 and the fourth sub-frame 504 satisfies $2^3:2^2:2^1:2^0=8:4:2:1$. This allows the light emitting device to exhibit 4-bit gray scale. Further, the number of bits and the number of gray scales are not limited to those as shown in this embodiment mode. For instance, one frame may be divided into eight sub-frames so as to achieve 8-bit gray scale.

The operation in one frame will be described. In the sub-frame 501, the writing operation is first performed in $1^{st}$ row to a last row, sequentially. Therefore, the starting time of the writing periods is varied for each row. The holding period 501$b$ sequentially starts in the rows in which the writing period 501$a$ has been terminated. In the holding period 501$b$, a light emitting element applied with a signal for emitting light remains in a light emitting state. Upon terminating the holding period 501$b$, the sub-frame 501 is changed to the next sub-frame 502 sequentially in the rows. In the sub-frame 502, a writing operation is sequentially performed in the $1^{st}$ row to the last row in the same manner as the sub-frame 501. The above-mentioned operations are carried out repeatedly up to the holding period 504$b$ of the sub-frame 504 and then terminated. After terminating the operation in the sub-frame 504, an operation in the next frame starts. Accordingly, the sum of the light-emitting time in respective sub-frames corresponds to the light emitting time of each light emitting element in one frame. By changing the light emitting time for each light emitting element and combining such the light emitting elements variously within one pixel, various display colors with different brightness and different chromaticity can be formed.

When the holding period is intended to be forcibly terminated in the row in which the writing period has already been terminated and the holding period has started prior to terminating the writing operation up to the last row as shown in the sub-frame 504, an erasing period 504$c$ is preferably provided after the holding period 504$b$ so as to stop light emission forcibly. The row where light emission is forcibly stopped does not emit light for a certain period (this period is referred to as a non light emitting period 504$d$). Upon terminating the writing period in the last row, a writing period of a next sub-frame (or, a next frame) starts sequentially from a first row. This can prevent the writing period in the sub-frame 504 from overlapping with the writing period in the next sub-frame.

Although the sub-frames 501 to 504 are arranged in order of increasing the length of the holding period in this embodiment mode, they are not necessary to be arranged in this order. For example, the sub-frames may be arranged in ascending order of the length of the holding period. Alternatively, the sub-frames may be arranged in random order. In addition, these sub-frames may further be divided into a plurality of frames. That is, scanning of gate signal lines may be performed at several times during a period of supplying same video signals.

The operations of the circuits in the writing period and the erasing period as shown in FIG. 4 will be described below.

The operation in the writing period will be described first. In the writing period, the gate signal line 911 in the $n^{th}$ row (n is a natural number) is electrically connected to the writing gate signal line driver circuit 913 via the switch 918. The gate signal line 911 in the $n^{th}$ row is not connected to the erasing gate signal line driver circuit 914. The source signal line 912 is electrically connected to the source signal line driver circuit 915 via the switch 920. In this case, a signal is input in a gate of the first transistor 901 connected to the gate signal line 911 in the $n^{th}$ row (n is a natural number), thereby turning the first transistor 901 on. At this moment, video signals are simultaneously input in the source signal lines in the first to last columns. Further, the video signals input from the source signal line 912 in each column are independent from one another. The video signals input from the source signal line 912 are input in a gate electrode of the second transistor 902 via the first transistor 901 connected to the respective source signal lines. At this moment, it is decided whether the light emitting element 903 emits light or emits no light depending on the signals input in the second transistor 902. For instance, when the second transistor 902 is a P-channel type, the light emitting element 903 emits light by inputting a low level signal in the gate electrode of the second transistor 902. On the other hand, when the second transistor 902 is an N-channel type, the light emitting element 903 emits light by inputting a high level signal in the gate electrode of the second transistor 902.

Next, the operation in the erasing period will be described. In the erasing period, the gate signal line 911 in the $n^{th}$ row (n is a natural number) is electrically connected to the erasing gate signal line driver circuit 914 via the switch 919. The gate signal line 911 in the $n^{th}$ row is not connected to the writing gate signal line deriver circuit 913. The source signal line 912 is electrically connected to the power source 916 via the switch 920. In this case, upon inputting a signal in the gate of the first transistor 901 connecting to the gate signal line 911 in the $n^{th}$ row, the first transistor 901 is turned on. At this moment, erasing signals are simultaneously input in the source signal lines in the first to last columns. The erasing signals input from the source signal line 912 are input in the gate electrode of the second transistor 902 via the first transistor 901 connecting to the respective source signal lines. A supply of current flowing through the light emitting element 903 from the current supply line 917 is forcibly stopped by the signals input in the second transistor 902. This makes the light emitting element 903 emit no light forcibly. For example, when the second transistor 902 is a P-channel type, the light emitting element 903 emits no light by inputting a high level signal in the gate electrode of the second transistor 902. On the other hand, when the second transistor 902 is an N-channel type, the light emitting element 903 emits no light by inputting a low level signal in the gate electrode of the second transistor 902.

Further, in the erasing period, a signal for erasing is input in the $n^{th}$ row (n is a natural number) by the above-mentioned operation. However, as mentioned above, the $n^{th}$ row sometimes remains in the erasing period while another row (e.g., a $m^{th}$ row (m is a natural number)) remains in the writing period. In this case, since a signal for erasing is necessary to be input in the $n^{th}$ row and a signal for writing is necessary to be input in the $m^{th}$ row by utilizing the source signal lines in the same columns, the after-mentioned operation is preferably carried out.

After the light emitting element 903 in the $n^{th}$ row becomes a non-light emitting state by the above-described operation in the erasing period, the gate signal line 911 and the erasing gate signal line driver circuit 914 are immediately disconnected to each other and the source signal line 912 is connected to the source signal line driver circuit 915 by turning the switch 920 on/off. The gate signal line 911 and the writing gate signal line driver circuit 913 are connected to each other while the source signal line and the source signal line driver circuit 915 are connected to each other. A signal is selectively input in the signal line in the $m^{th}$ row from the writing gate signal line driver circuit 913 and the first transistor is turned on while signals for writing are input in the source signal lines in the first to last columns from the source signal line driver circuit 915. By inputting these signals, the light emitting element in the $m^{th}$ row emits light or no light.

After terminating the writing period in the $m^{th}$ row as mentioned above, the erasing period immediately starts in the $n+1^{th}$ row. Therefore, the gate signal line 911 and the writing gate signal line driver circuit 913 are disconnected to each other and the source signal line is connected to the power source 916 by turning the switch 920 on/off. Also, the gate signal line 911 and the writing gate signal line driver circuit 913 are disconnected to each other and the gate signal line 911 is connected to the erasing gate signal line driver circuit 914. A signal is selectively input in the gate signal line in the $n+1^{th}$ row from the erasing gate signal line driver circuit 914 and the first transistor is turn on while an erasing signal is input therein from the power source 916. Upon terminating the erasing period in the $n+1^{th}$ row in this manner, the writing period immediately starts in the $m+1^{th}$ row. The erasing period and the writing period may be repeated alternatively until the erasing period of the last row.

Although the writing period of the $m^{th}$ row is provided between the erasing period of the $n^{th}$ row and the erasing period of the $n+1^{th}$ row in this embodiment mode, the present invention is not limited thereto. The writing period of the $m^{th}$ row may be provided between the erasing period in the $n-1^{th}$ row and the erasing period in the $n^{th}$ row.

Furthermore, in this embodiment mode, when the non-light emitting period 504d is provided like the sub-frame 504, the operation of disconnecting the erasing gate signal line driver circuit 914 from one gate signal line while connecting the writing gate signal line driver circuit 913 to another gate signal line is carried out repeatedly. This operation may be performed in a frame in which a non-light emitting period is not particularly provided.

Embodiment Mode 4

An example of a cross sectional view of a light emitting device including a light emitting element according to the invention will be described with reference to FIGS. 7A to 7C.

Figure 7A:
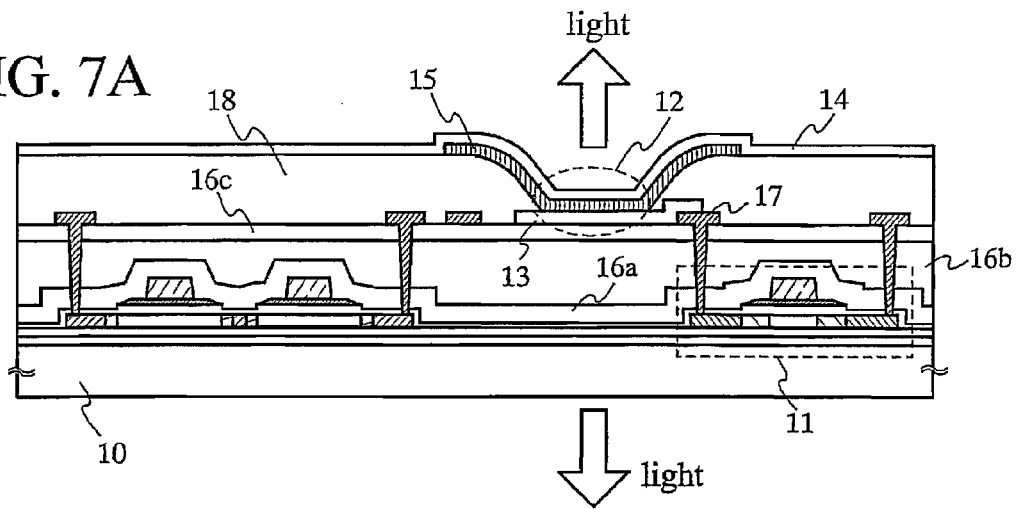
FIGS. 7A to 7C are cross sectional views of light emitting devices according to the invention.
Figure 7B:
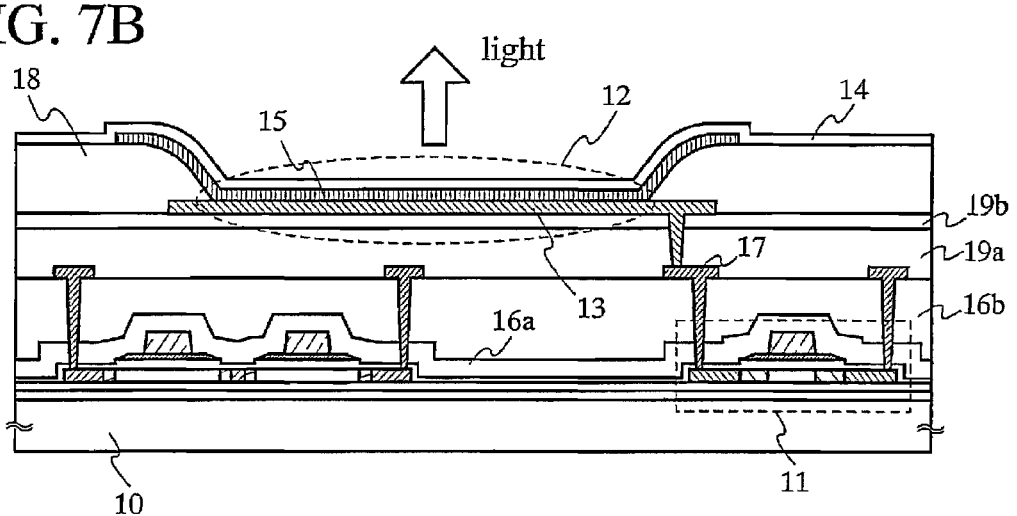
Figure 7C:
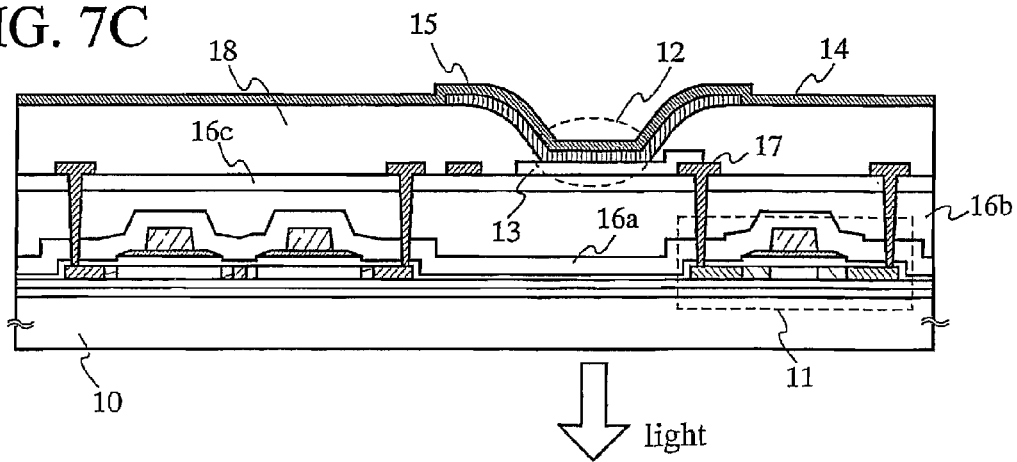

In each of FIGS. 7A to 7C, a region surrounded by a dashed line represents a transistor 11 that is provided for driving a light emitting element 12 of the invention. The light emitting element 12 of the invention comprises a layer 15 in which a lamination of a layer generating holes, a layer generating electrons and a layer including a light emitting substance is provided between a first electrode 13 and a second electrode 14. A drain of the transistor 11 and the first electrode 13 are electrically connected to each other by a wiring 17 that passes through a first interlayer insulating film 16 (16a, 16b and 16c). The light emitting element 12 is isolated from another light emitting elements provided adjacent to the light emitting element 12 by a partition wall layer 18. The light emitting device of the invention having this structure is provided over a substrate 10 in this embodiment mode.

The transistor 11 as shown in each FIGS. 7A to 7C is a top-gate type transistor in which a gate electrode is provided on a side of a semiconductor layer opposite to the substrate. Further, the structure of the transistor 11 is not particularly limited. For example, a bottom-gate type transistor may be employed. In the case of using a bottom-gate type transistor, either a transistor in which a protection film is formed on a semiconductor layer of a channel (a channel protection type transistor) or a transistor in which a part of a semiconductor layer of a channel is etched (a channel etched type transistor) may be used.

The semiconductor layer included in the transistor 11 may be any of a crystalline semiconductor, an amorphous semiconductor, a semiamorphous semiconductor, and the like.

Concretely, the semiamorphous semiconductor has an intermediate structure between an amorphous structure and a crystalline structure (including a single crystalline structure and a polycrystalline structure), and a third condition that is stable in term of free energy. The semiamorphous semiconductor further includes a crystalline region having a short range order along with lattice distortion. A crystal grain with a size of 0.5 to 20 nm is included in at least a part of an semiamorphous semiconductor film. Raman spectrum is shifted toward lower wavenumbers than 520 cm$^{-1}$. The diffraction peaks of (111) and (220), which are believed to be derived from Si crystal lattice, are observed in the semiamorphous semiconductor by the X-ray diffraction. The semiamorphous semiconductor contains hydrogen or halogen of at least 1 atom % or more for terminating dangling bonds. The semiamorphous semiconductor is also referred to as a microcrystalline semiconductor. The semiamorphous semiconductor is formed by glow discharge decomposition with silicide gas (plasma CVD). As for the silicide gas, $SiH_4$, $Si_2H_6$, $SiH_2Cl_2$, $SiHCl_3$, $SiCl_4$, $SiF_4$ and the like can be used. The silicide gas may also be diluted with $H_2$, or a mixture of $H_2$ and one or more of rare gas elements selected from He, Ar, Kr and Ne. The dilution ratio is set to be in the range of 1:2 to 1:1,000. The pressure is set to be approximately in the range of 0.1 to 133 Pa. The power frequency is set to be 1 to 120 MHz, preferably, 13 to 60 MHz. The substrate heating temperature may be set to be 300° C. or less, more preferably, 100 to 250° C. With respect to impurity elements contained in the film, each concentration of impurities for atmospheric constituents such as oxygen, nitrogen and carbon is preferably set to be $1 \times 10^{20}/cm^3$ or less. In particular, the oxygen concentration is set to be $5 \times 10^{19}/cm^3$ or less, preferably, $1 \times 10^{19}/cm^3$ or less.

As a specific example of a crystalline semiconductor layer, a semiconductor layer made from single crystalline silicon, polycrystalline silicon, silicon germanium, or the like can be cited. These materials may be formed by laser crystallization. For example, these materials may be formed by crystallization with use of the solid phase growth method using nickel and the like.

When a semiconductor layer is made from an amorphous substance, e.g., amorphous silicon, it is preferable to use a light emitting device with circuits including only N-channel transistors as the transistor 11 and other transistor (a transistor included in a circuit for driving a light emitting element). Alternatively, a light emitting device with circuits including either N-channel transistors or P-channel transistors may be employed. Also, a light emitting device with circuits including both an N-channel transistor and a P-channel transistor may be used.

The first interlayer insulating film 16 may include plural layers (e.g., interlayer insulating films 16a, 16b and 16c) as shown in FIGS. 7A to 7C or a single layer. The interlayer insulating film 16a is made from an inorganic material such as silicon oxide and silicon nitride. The interlayer insulating film 16b is made from acrylic, siloxane (which is a substance that has a skeleton structure formed by silicon (Si)-oxygen (O) bonds and includes an organic group such as an alkyl group as its substituent), or a substance with a self-planarizing property that can be formed by applying a liquid such as silicon oxide. The interlayer insulating film 16c is made from a silicon nitride film containing argon (Ar). The substances constituting the respective layers are not particularly limited thereto. Therefore, substances other than the above-mentioned substances may be employed. Alternatively, the above-mentioned substances may be used in combination with a substance other than the above-mentioned substances. Accordingly, the first interlayer insulating film 16 may be formed by using both an inorganic material and an organic material or by using either an inorganic material or an organic material.

The edge portion of the partition wall layer 18 preferably has a shape in which the radius of curvature is continuously varied. This partition wall layer 18 is formed by using acrylic, siloxane, resist, silicon oxide, and the like. Further, the partition wall layer 18 may be made from any one of or both an inorganic film and an organic film.

FIGS. 7A and 7C show the structures in which only the first interlayer insulating films 16 are sandwiched between the transistors 11 and the light emitting elements 12. Alternatively, as shown in FIG. 7B, the first interlayer insulating film 16 (16a and 16b) and a second interlayer insulting film 19 (19a and 19b) may be provided between the transistor 11 and the light emitting element 12. In the light emitting device as shown in FIG. 7B, the first electrode 13 passes through the second interlayer insulating film 19 to be connected to the wiring 17.

The second interlayer insulating film 19 may include either plural layers or a single layer as well as the first interlayer insulating film 16. The interlayer insulating film 19a is made from acrylic, siloxane, or a substance with a self-planarizing property that can be formed by applying a liquid such as silicon oxide. The interlayer insulating film 19b is made from a silicon nitride film containing argon (Ar). The substances constituting the respective interlayer insulating layers are not particularly limited thereto. Therefore, substances other than the above-mentioned substances may be employed. Alternatively, the above-mentioned substances may be used in combination with a substance other than the above-mentioned substances. Accordingly, the second interlayer insulating film 19 may be formed by using both an inorganic material and an organic material or by using either an inorganic material or an organic material.

When the first electrode and the second electrode are both formed by using a substance with a light transmitting property in the light emitting element 12, light generated in the light emitting element 12 can be emitted through both the first electrode 13 and the second electrode 14 as shown in arrows in FIG. 7A. When only the second electrode 14 is made from a substance with a light transmitting property, light generated in the light emitting element 12 can be emitted only through the second electrode 14 as shown in an arrow of FIG. 7B. In this case, the first electrode 13 is preferably made from a material with high reflectance or a film (reflection film) made from a material with high reflectance is preferably provided under the first electrode 13. When only the first electrode 13 is made from a substance with a light transmitting property, light generated in the light emitting element 12 can be emitted only through the first electrode 13 as shown in an arrow of FIG. 7C. In this case, the second electrode 14 is preferably made from a material with high reflectance or a reflection film is preferably provided over the second electrode 14.

Moreover, the light emitting element 12 may be formed by laminating the layer 15 that is operated in applying the voltage to the light emitting element such that a potential of the second electrode 14 is higher than that of the first electrode 13. Alternatively, the light emitting element 12 may be formed by laminating the layer 15 that is operated in applying the voltage to the light emitting element such that a potential of the second electrode 14 is lower than that of the first electrode 13. In the former case, the transistor 11 is an N-channel transistor. In the latter case, the transistor 11 is a P-channel transistor.

As set forth above, an active light emitting device that controls the driving of the light emitting element using the transistor is described in this embodiment mode. In addition, a passive light emitting device that drives a light emitting element without providing a driving element such as a transistor may be employed. In this passive light emitting device, it can be driven at low power consumption by using the light emitting element of the invention that is operated at a low driving voltage.

Embodiment Mode 5

By mounting a light emitting device according to the present invention, an electronic appliance with a slight increase of power consumption in a display portion or the like can be obtained. Also, by mounting a light emitting device of the invention, an electronic appliance such as a display device capable of displaying favorable images with few defects in pixels and the like can be obtained. Furthermore, by mounting the light emitting device of the invention, an electronic appliance having low power consumption can be obtained.

Figure 8A:
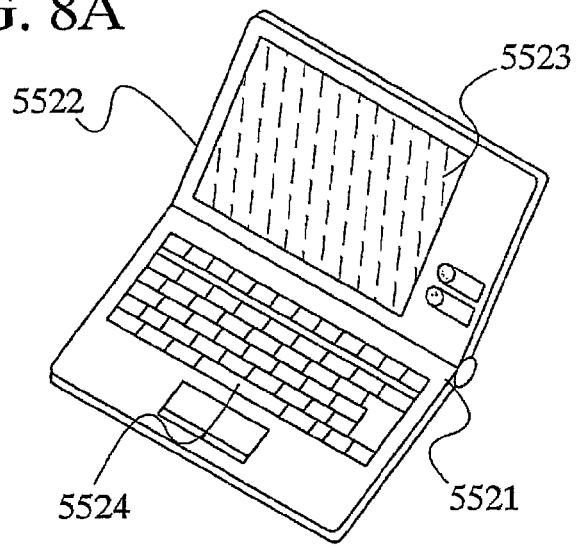
FIGS. 8A to 8C are diagrams showing electronic appliances according to the invention.
Figure 8B:
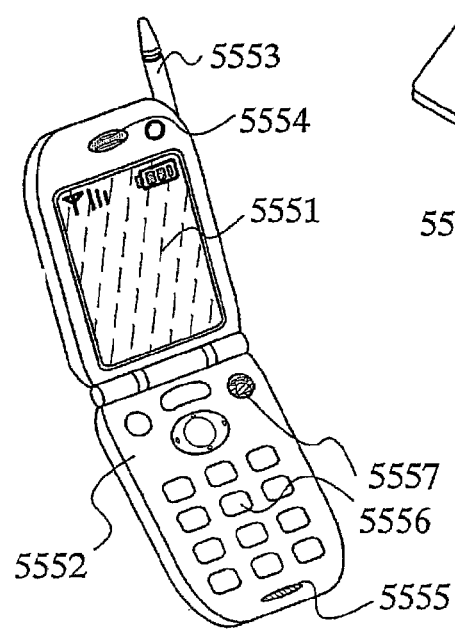
Figure 8C:
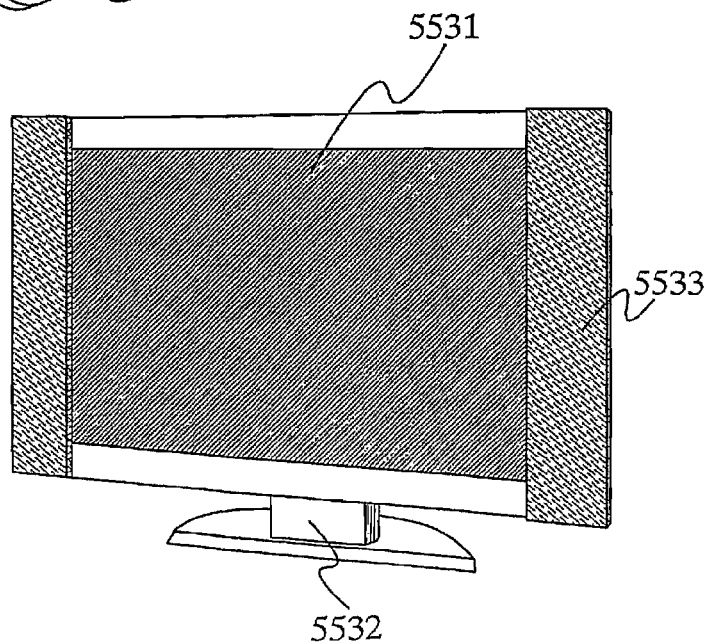

Examples of electronic appliances mounted with the light emitting devices according to the invention are illustrated in FIGS. 8A to 8C.

FIG. 8A is a laptop personal computer manufactured according to the invention, including a main body 5521, a housing 5522, a display portion 5523, a keyboard 5524 and the like. The laptop personal computer can be achieved by incorporating the light emitting device including the light emitting element of the invention thereinto as the display portion 5523.

FIG. 8B is a cellular phone manufactured according to the invention, including a main body 5552, a display portion 5551, an audio output portion 5554, an audio input portion 5555, operation switches 5556 and 5557, an antenna 5553 and the like. The cellular phone can be achieved by incorporating the light emitting device including the light emitting element of the invention thereinto as the display portion 5551.

FIG. 8C is a television set manufactured according to the invention, including a display portion 5531, a housing 5532, speakers 5533 and the like. The television set can be achieved by incorporating the light emitting device including the light emitting element of the invention thereinto is the display portion 5531.

As set forth above, the light emitting devices of the invention are suitable to be used as the display portions of various kinds of electronic appliances.

Further, the light emitting devices having the light emitting elements of the invention are mounted on the laptop personal computer, the cellular phone and the television set. However, the light emitting devices having the light emitting elements of the invention can be mounted on a navigation system, a lighting appliance and the like.

Embodiment 1

Figure 2:
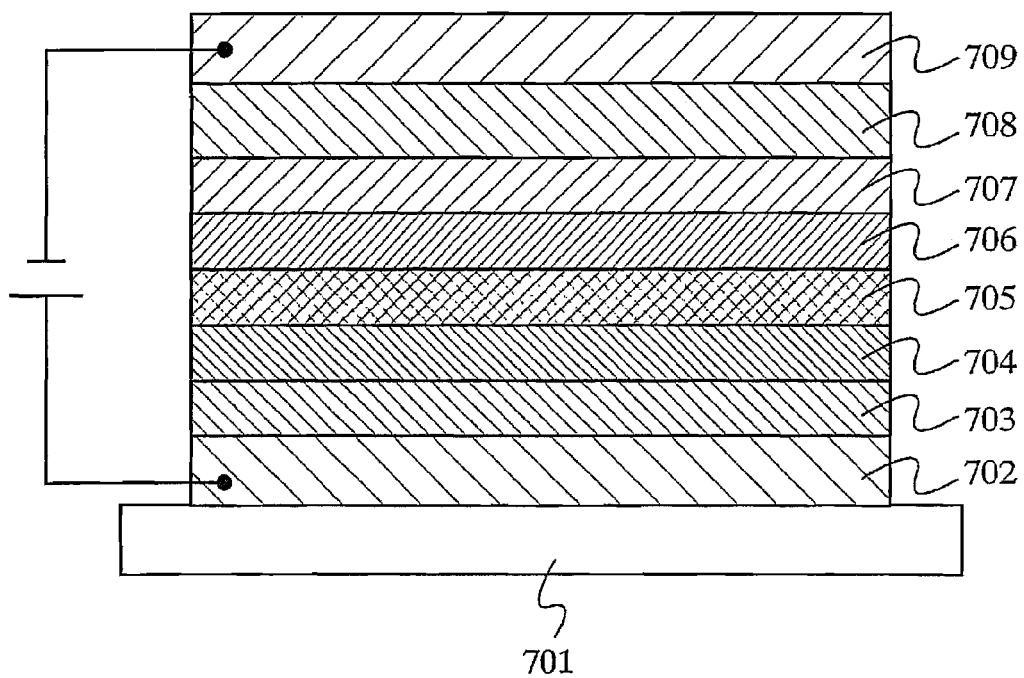
FIG. 2 is a view showing a laminated structure of a light emitting element according to the present invention.

Methods for manufacturing four light emitting elements (i.e., a light emitting element 1, a light emitting element 2, a light emitting element 3 and a light emitting element 4) each having a different mixture ratio of a substance with a hole transporting property to a substance having an electron accepting property with respect to the substance with the hole transporting property in a layer having a function of generating holes, and characteristics of these elements will be described in this embodiment with reference to FIG. 2.

Indium tin oxide containing silicon was formed over a substrate 701 by sputtering to form a second electrode 702. The second electrode 702 was formed to have a thickness of 110 nm. Further, a substrate made of glass was used as the substrate 701.

Next, a layer 703 including molybdenum oxide was formed on the second electrode 702 by vacuum evaporation of the molybdenum oxide. The layer 703 was formed to have a thickness of 5 nm.

Next, a layer 704 including 4,4'-bis[N-(1-naphthyl)-N-phenylamino]biphenyl (abbreviation: NPB) was formed on the layer 703 by vacuum evaporation of the NPB. The layer 704 was formed to have a thickness of 55 nm.

A layer 705 including tris(8-quinolinolato)aluminum (abbreviation: $Alq_3$) and coumarin 6 was formed on the layer 704 by co-evaporation of the $Alq_3$ and the coumarin 6. The $Alq_3$-coumarin 6 weight ratio was adjusted to satisfy 1:0.005. Accordingly, the coumarin 6 is dispersed in $Alq_a$. The thickness of the layer 705 was set to be 35 nm. Further, the co-evaporation is an evaporation method that is performed simultaneously from plural evaporation sources.

A layer 706 including $Alq_3$ was formed on the layer 705 by vacuum evaporation of the $Alq_3$. The thickness of the layer 706 was set to be 10 nm.

Next, a second layer 707 including $Alq_3$ and lithium (Li) was formed on the layer 706 by co-evaporation of the $Alq_3$ and the lithium. The $Alq_3$-lithium weight ratio was adjusted to satisfy 1:0.01. Accordingly, the lithium is dispersed in the $Alq_3$. The thickness of the second layer 707 was set to be 10 nm.

Subsequently, a first layer 708 including NPB and molybdenum oxide was formed on the second layer 707 by co-evaporation of the NPB and the molybdenum oxide. At this moment, with respect to the light emitting element 1, the molar ratio between the NPB and the molybdenum oxide (=molybdenum oxide/NPB) was adjusted to satisfy 0.5. With respect to the light emitting element 2, the molar ratio between the NPB and the molybdenum oxide (=molybdenum oxide/NPB) was adjusted to satisfy 1.0. With respect to the light emitting element 3, the molar ratio between the NPB and the molybdenum oxide (=molybdenum oxide/NPB) was adjusted to satisfy 1.5. With respect to the light emitting element 4, the molar ratio between the NPB and the molybdenum oxide (=molybdenum oxide/NPB) was adjusted to satisfy 2.0. The thicknesses of the second layers for the respective light emitting elements were set to be 20 nm.

Next, a first electrode 709 was formed on the first layer 708 by vacuum evaporation of aluminum. The thickness of the first electrode was set to be 100 nm.

When current flows through each light emitting element manufactured above by applying the voltage thereto such that a potential of the second electrode 702 is higher than that of the first electrode 709, holes generated in the first layer 708 are injected in the first electrode 709 while electrons generated in the second layer 707 are injected in the layer 706. The holes are injected in the layer 703 from the second electrode 702. The holes injected from the second electrode 702 and the electrons injected from the second layer 707 are recombined in the layer 705, allowing the coumarin 6 to emit light. Accordingly, the layer 705 serves as a light emitting layer. Further, the layer 703 serves as a hole injecting layer. The layer 704 serves as a hole transporting layer. The layer 706 serves as an electron transporting layer. In each light emitting element of the present embodiment, the substances included in the layer 706 and a substance with an electron transporting property included in the second layer 707 are both $Alq_3$ and have equivalent electron affinity.

Figure 9:
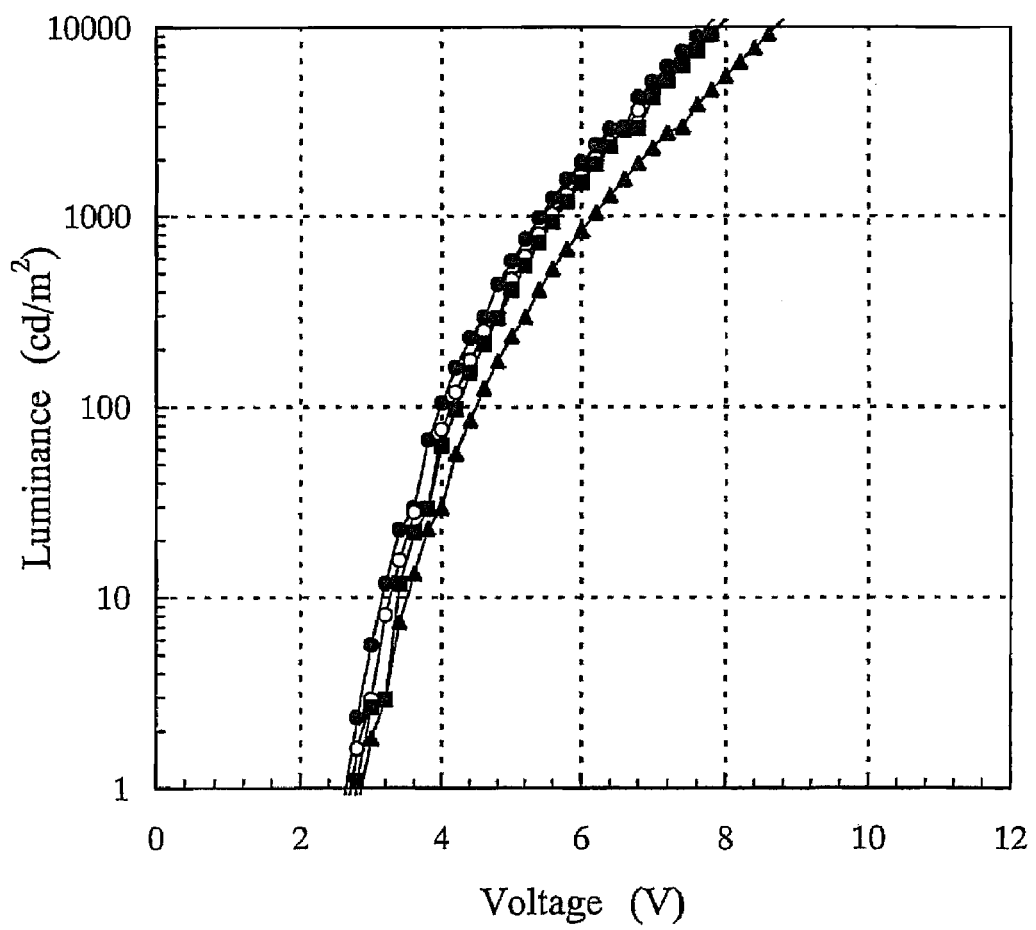
FIG. 9 is a graph showing the voltage-luminance characteristics of a light emitting element according to the invention.
Figure 10:
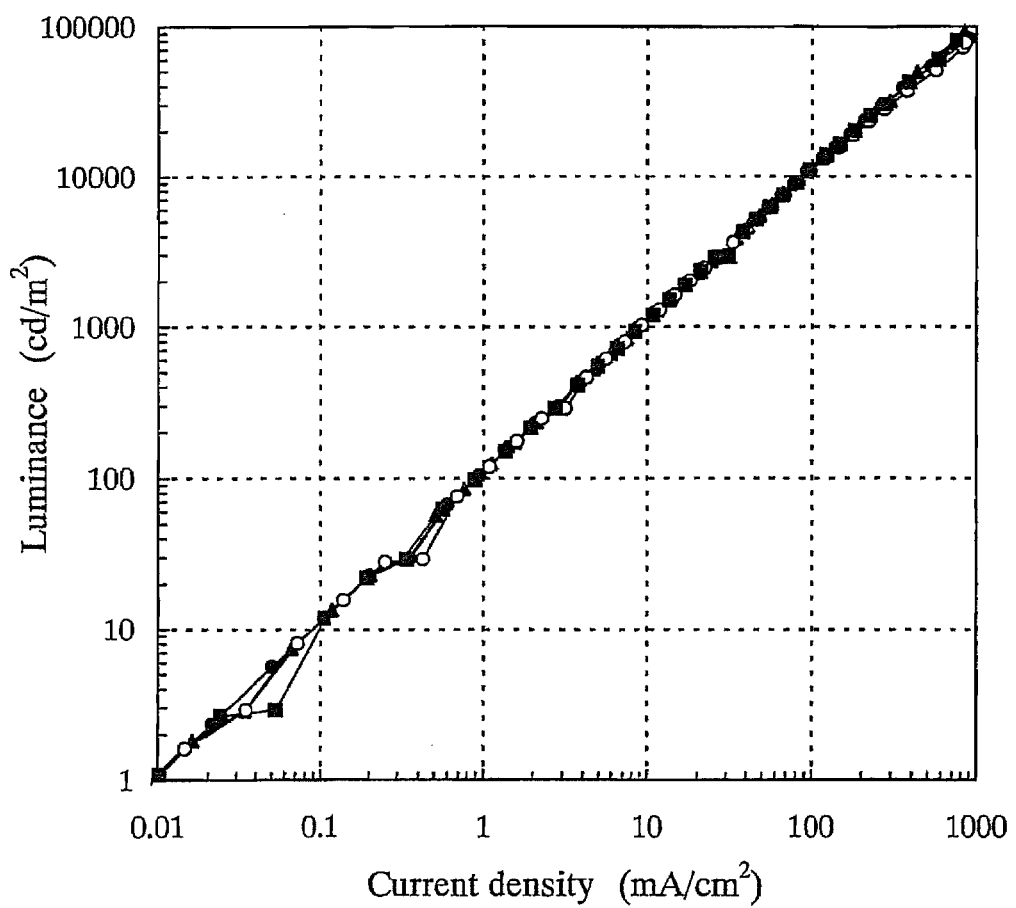
FIG. 10 is a graph showing the current density-luminance characteristics of a light emitting element according to the invention.
Figure 11:
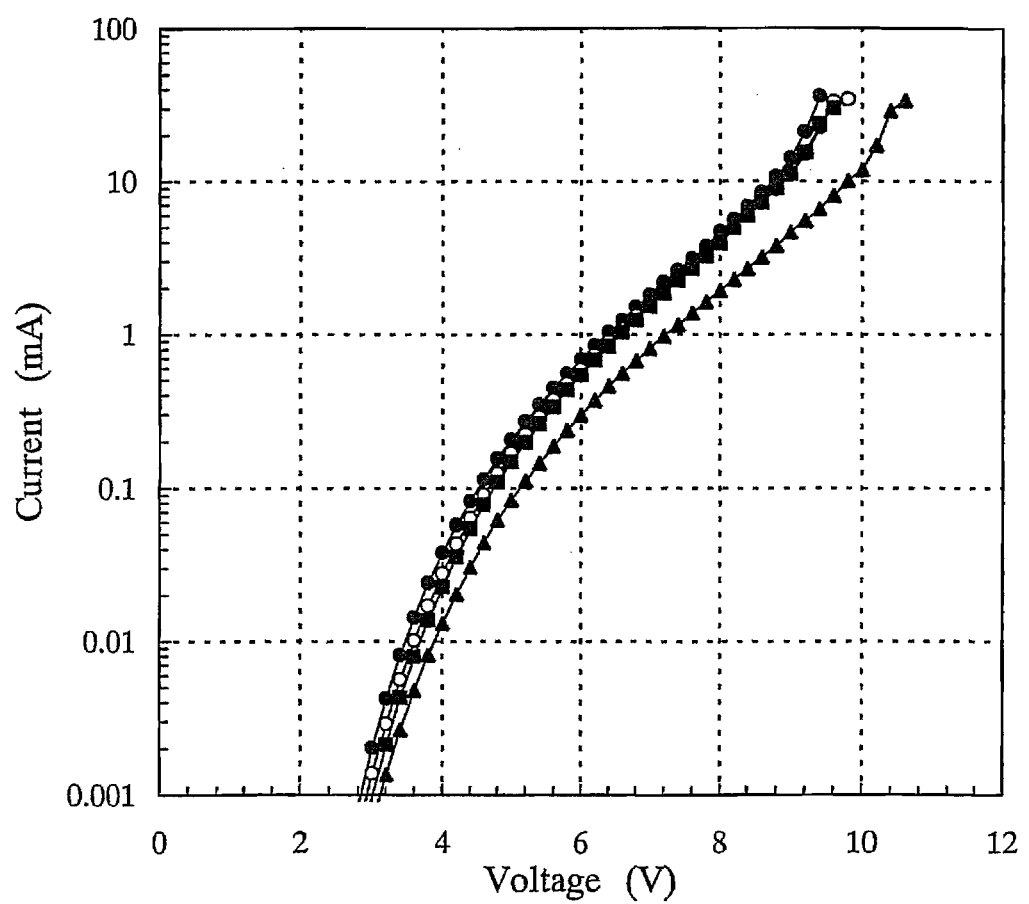
FIG. 11 is a graph showing the voltage-current characteristics of a light emitting element according to the invention.

FIG. 9 shows the voltage-luminance characteristics of the light emitting elements according to the present embodiment, FIG. 10 shows the current density-luminance characteristics thereof, and FIG. 11 shows the voltage-current characteristics thereof. In FIG. 9, a horizontal axis represents the voltage (V) while a perpendicular axis represents the luminance ($cd/m^2$). In FIG. 10, a horizontal axis represents the current density ($mA/cm^2$) while a perpendicular axis represents luminance ($cd/m^2$). In FIG. 11, a horizontal axis represents the voltage (V) while a perpendicular axis represents the current (mA). In FIGS. 9, 10 and 11, a curve marked by ▲ indicates the characteristics of the light emitting element 1, a curve marked by • indicates the characteristics of the light emitting element 2, a curve marked by ○ indicates the characteristics of the light emitting element 3, and a curve marked by ■ indicates the characteristics of the light emitting element 4.

According to FIGS. 9, 10 and 11, it is known that respective light emitting elements are operated favorably. In particular, it is known that the light emitting elements 2, 3 and 4 have the higher luminance, which is obtained by applying the predetermined voltage to the light emitting elements, and the larger amount of current, wherein the molar ratios between the NPB and the molybdenum oxide (i.e., molybdenum oxide/NPB) of the respective first layers 708 satisfy 1 to 2. Accordingly, by adjusting the molar ratio between the NPB and the molybdenum oxide (i.e., molybdenum oxide/NPB) to satisfy 1 to 2, a light emitting element capable of operating at low driving voltage can be obtained.

Next, results of carrying out a continuous lighting test using the light emitting elements of the present embodiment will be described. The continuous lighting test was performed as shown below at normal temperature after sealing the above-manufactured light emitting elements under nitrogen atmosphere.

Figure 12:
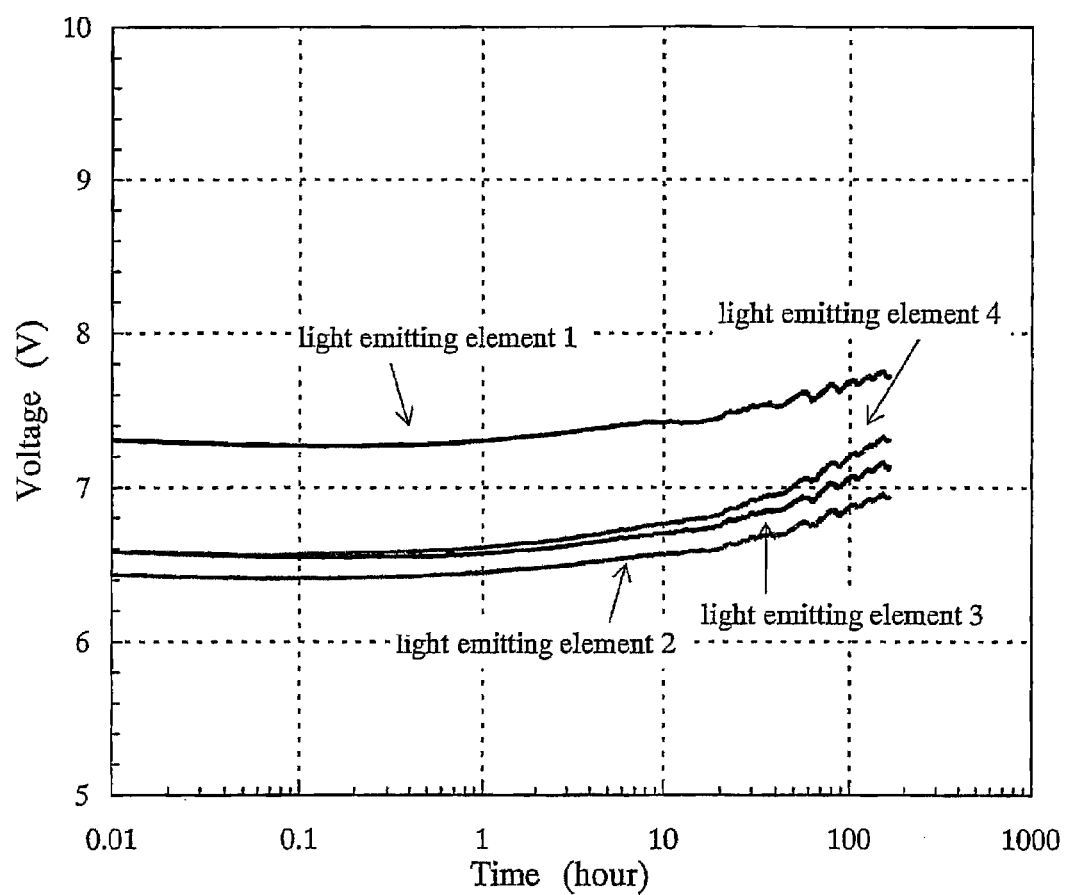
FIG. 12 is a graph showing results obtained by measuring the change in voltage with time of a light emitting element according to the invention.
Figure 13:
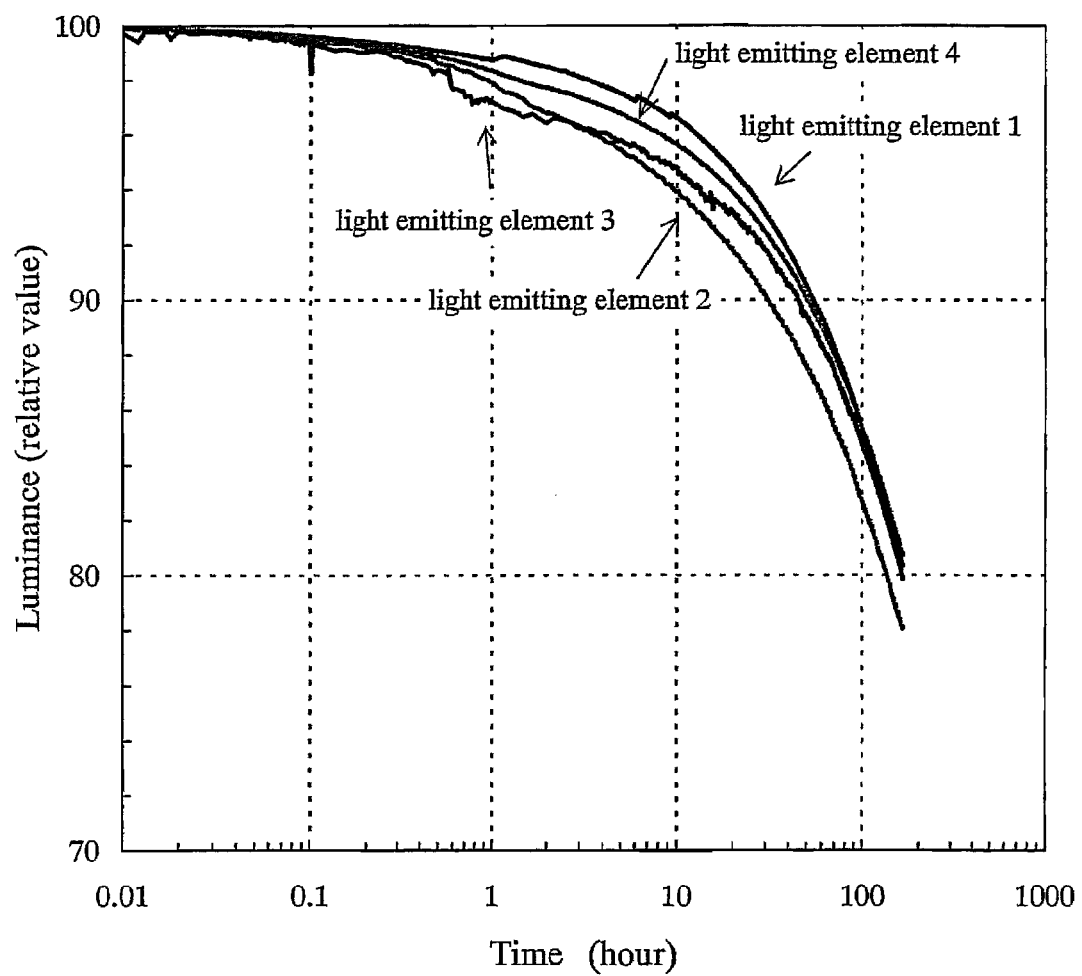
FIG. 13 is a graph showing results obtained by measuring the change in luminance with time of a light emitting element according to the invention.

As shown in FIG. 10, the light emitting element of the present invention under an initial condition requires the current density of 26.75 $mA/cm^2$ to emit light at the luminance of 3,000 $cd/m^2$. In this embodiment, the change in voltage with time and the change in luminance with time that were required for flowing the current of 26.75 $mA/cm^2$ were examined while flowing the current of 26.75 $mA/cm^2$ for a certain period. The measurement results are shown in FIG. 12 and FIG. 13. In FIG. 12, a horizontal axis represents time passage (hour) while a perpendicular axis represents the voltage (V) required for flowing the current of 26.75 $mA/cm^2$. Also, in FIG. 13, a horizontal axis represents time passage (hour) while a perpendicular axis represents the luminance (at a given unit). Further, the luminance (at a given unit) is a relative value with respect to the initial luminance (i.e., the luminance at a given time is divided by the initial luminance and then multiplied by 100), wherein the luminance in an initial condition is expressed as 100.

According to FIG. 12, it is known that the voltage required for flowing the current with the current density of 26.75 $mA/cm^2$ is increased to only about 1 V from the initial condition after a lapse of 100 hours. Consequently, it is known that the light emitting elements are favorable elements having slight rise in voltage with time passage.

Embodiment 2

Figure 14:
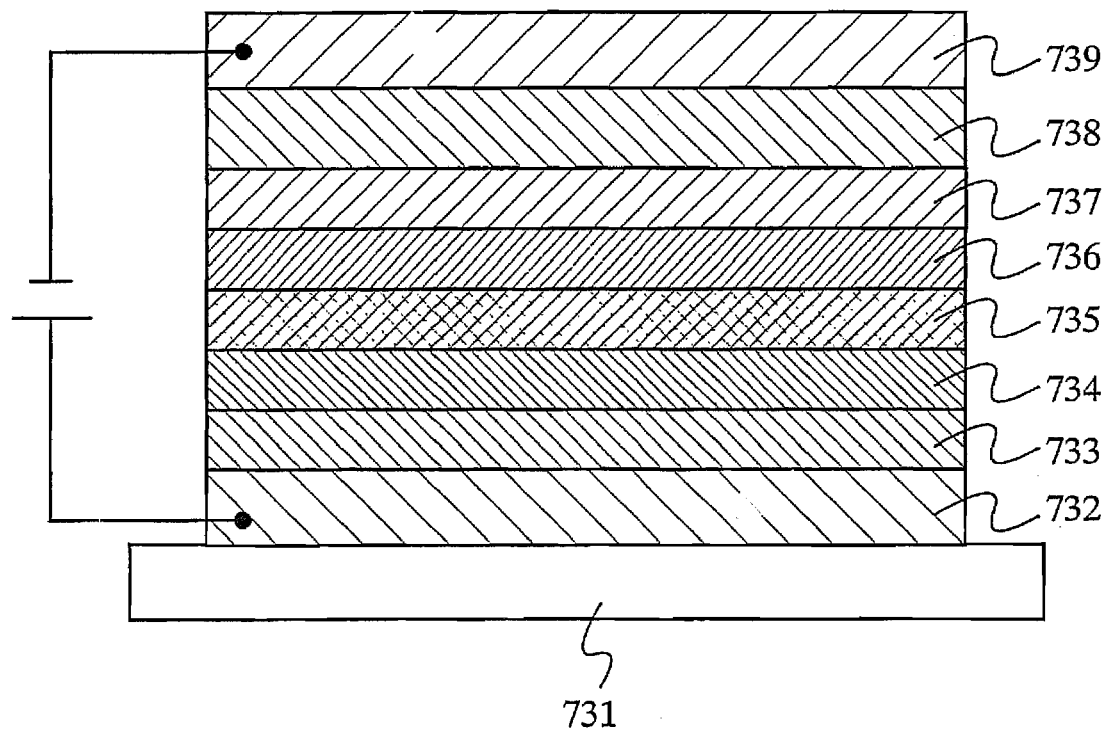
FIG. 14 is a view showing a laminated structure of a light emitting element according to the invention.

A method for manufacturing a light emitting element of the present invention will be described below with reference to FIG. 14.

Indium tin oxide containing silicon was formed over a substrate 731 by sputtering to form a second electrode 732. The thickness of the second electrode 732 was set to be 110 nm. Further, a substrate made of glass was used as the substrate 731.

Next, a layer 733 including molybdenum oxide and NPB was formed on the second electrode 732 by co-evaporation of the molybdenum oxide and the NPB. The thickness of the layer 733 was set to be 50 nm.

Subsequently, a layer 734 including NPB was formed on the layer 733 by vacuum evaporation of the NPB. The thickness of the layer 734 was set to be 10 nm.

A layer 735 including tris(8-quinolinolato)aluminum (abbreviation: $Alq_3$) and coumarin 6 was formed on the layer 734 by co-evaporation of the $Alq_3$ and the coumarin 6. The $Alq_3$-coumarin 6 weight ratio was adjusted to satisfy 1:0.005 so that the coumarin 6 was dispersed in $Alq_3$. The thickness of the layer 735 was set to be 35 nm. Further, the co-evaporation is an evaporation method that is performed simultaneously from plural evaporation sources.

A layer 736 including $Alq_3$ was formed on the layer 735 by vacuum evaporation of the $Alq_3$. The thickness of the layer 736 was set to be 10 nm.

A second layer 737 including $Alq_3$ and lithium (Li) was formed on the layer 736 by co-evaporation of the $Alq_3$ and the lithium. The $Alq_3$-lithium weight ratio was adjusted to satisfy 1:0.01 so that the lithium was dispersed in the $Alq_3$. The thickness of the second layer 737 was set to be 10 nm.

Next, a first layer 738 including NPB and molybdenum oxide was formed on the second layer 737 by co-evaporation of the NPB and the molybdenum oxide. The molar ratio between the NPB and the molybdenum oxide (i.e., molybdenum oxide/NPB) was adjusted to be 1.0. The thickness of the first layer 738 was set to be 20 nm.

A first electrode 739 was formed on the first layer 738 by vacuum evaporation of aluminum. The thickness of the first electrode 739 was set to be 100 nm.

When the current flows through the above-manufactured light emitting element by applying the voltage thereto such that a potential of the second electrode 732 is higher than that of the first electrode 739, holes generated in the first layer 738 are injected in the first electrode 739 while electrons generated in the second layer 737 are injected in the layer 736. The holes are injected in the layer 733 from the second electrode 732. The holes injected from the second electrode 732 and the electrons injected from the second layer 737 are recombined in the layer 735, allowing the coumarin 6 to emit light. Accordingly, the layer 735 serves as a light emitting layer. Further, the layer 733 serves as a hole injecting layer. The layer 734 serves as a hole transporting layer. The layer 736 serves as an electron transporting layer. In the light emitting element according to the present embodiment, the substances included in the layer 736 and a substance with an electron transporting property included in the second layer 737 are both $Alq_3$ and have equivalent electron affinity.

Comparative Example

Figure 15:
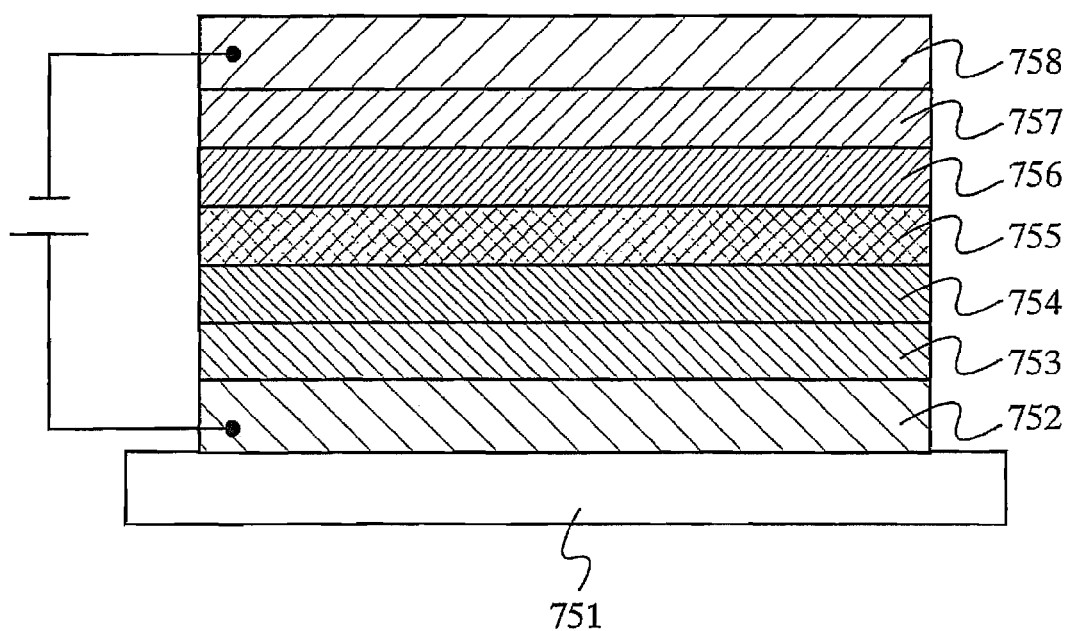
FIG. 15 is a view showing a laminated structure of a light emitting element according to the invention.

Next, a method for manufacturing a light emitting element of the comparative example will be described with reference to FIG. 15.

Indium tin oxide containing silicon was formed over a substrate 751 by sputtering to form a second electrode 752. The thickness of the second electrode 752 was set to be 110 nm. A substrate made of glass was used as the substrate 751.

Next, a layer 753 including molybdenum oxide and NPB was formed on the second electrode 752 by co-evaporation of the molybdenum oxide and the NPB. The thickness of the layer 753 was set to be 50 nm.

A layer 754 including NPB was formed on the layer 753 by vacuum evaporation of the NPB. The thickness of the layer 754 was set to be 10 nm.

A layer 755 including $Alq_3$ and coumarin 6 was formed on the layer 754 by co-evaporation of $Alq_3$ and coumarin 6. The $Alq_3$-coumarin 6 weight ratio was adjusted to satisfy 1:0.005 so that the coumarin 6 was dispersed in $Alq_3$. The thickness of the layer 755 was set to be 35 nm.

A layer 756 including $Alq_3$ was formed on the layer 755 by vacuum evaporation of the $Alq_3$. The thickness of the layer 756 was set to be 10 nm.

Next, a second layer 757 including $Alq_3$ and lithium (Li) was formed on the layer 756 by co-evaporation of the $Alq_3$ and the lithium. The $Alq_3$-lithium weight ratio was adjusted to satisfy 1:0.01 so that the lithium was dispersed in the $Alq_3$. The thickness of the second layer 757 was set to be 10 nm.

Next, a first electrode 758 was formed on the second layer 757 by vacuum evaporation of aluminum. The thickness of the first electrode 758 was set to be 100 nm.

The light emitting element of the comparative example was manufactured in the above-described manner to be compared with the light emitting element of Embodiment 2 according to the present invention. As seen from the above, the light emitting element of the comparative example does not include a layer corresponding to the first layer 738 of Embodiment 2.

Figure 16:
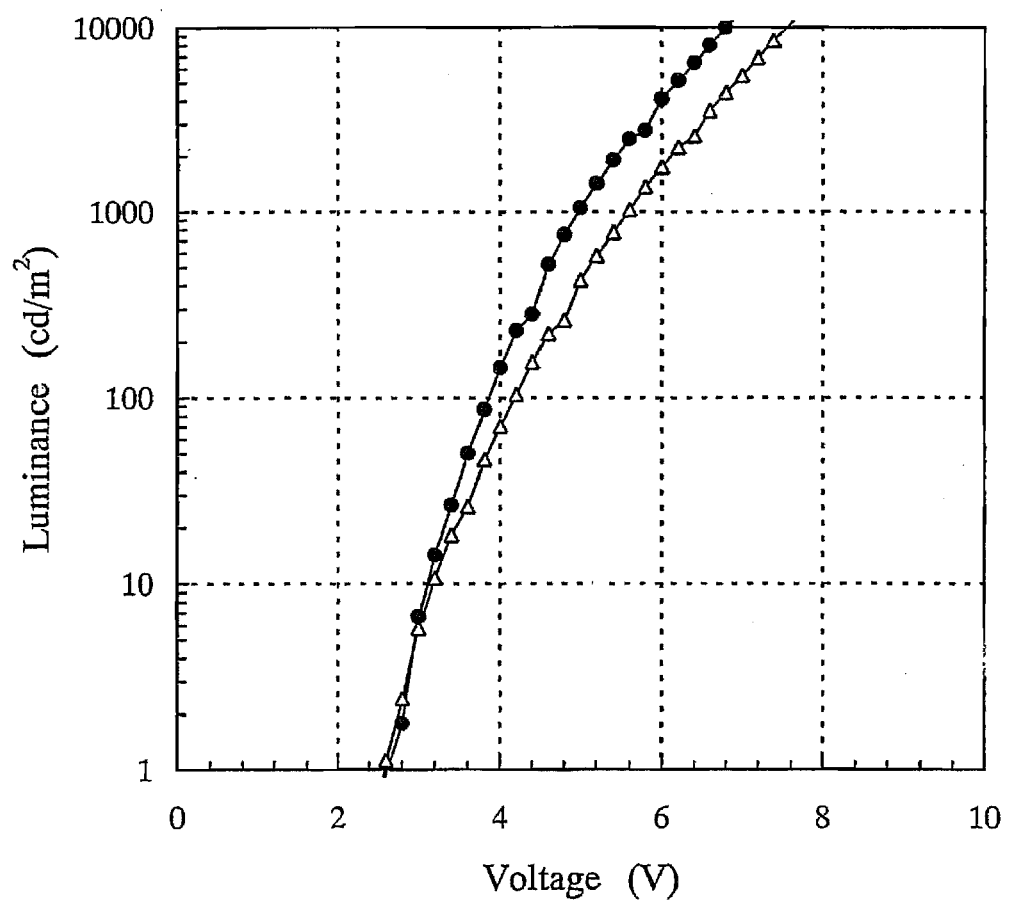
FIG. 16 is a graph showing the voltage-luminance characteristics of a light emitting element according to the invention and a light emitting element according to the comparative example.
Figure 17:
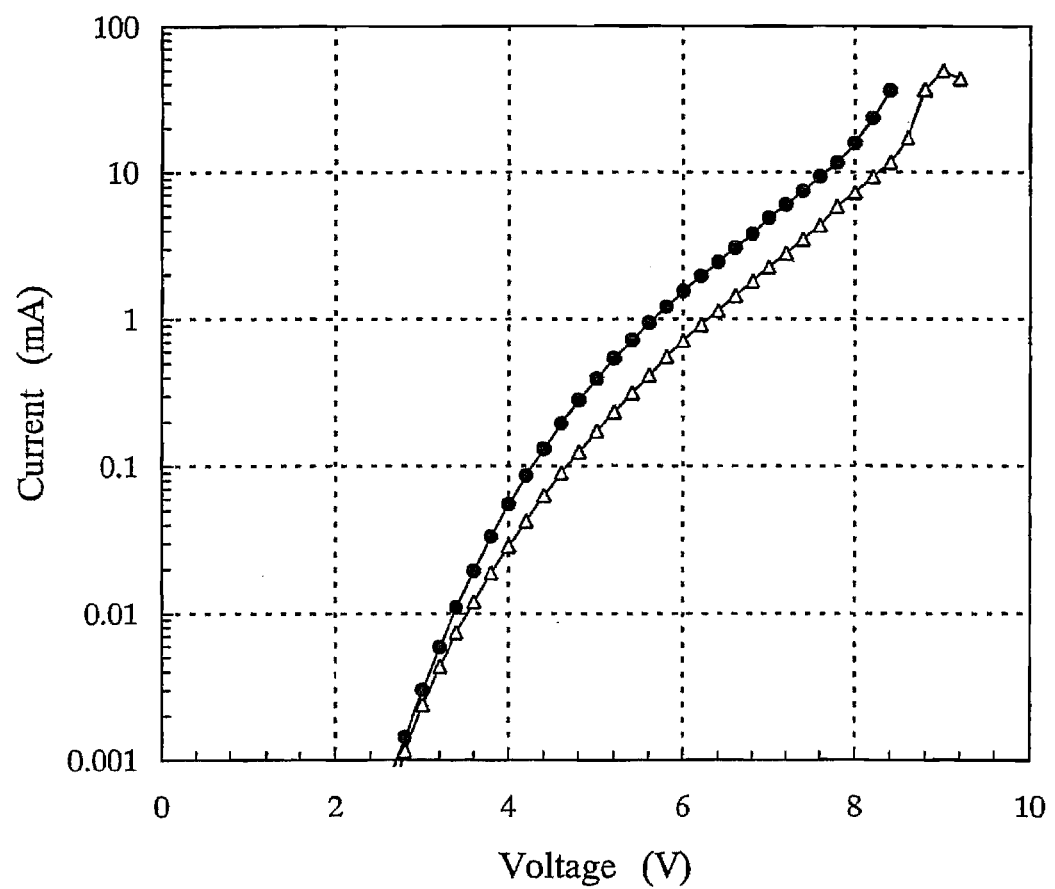
FIG. 17 is a graph showing the voltage-current characteristics of a light emitting element according to the invention and a light emitting element according to the comparative example.

The voltage-luminance characteristics of the light emitting element of Embodiment 2 and the light emitting element of the comparative example are shown in FIG. 16 while the voltage-current characteristics thereof are shown in FIG. 17. In FIG. 16, a horizontal axis represents the voltage (V) and a perpendicular axis represents the luminance ($cd/m^2$). In FIG. 17, a horizontal axis represents the voltage (V) and a perpendicular axis represents the current (mA). In FIG. 16 and FIG. 17, a curve marked by • indicates the characteristics of the light emitting element of Embodiment 2 (present invention) whereas a curve marked by ▲ indicates the characteristics of the light emitting element of the comparative example.

According to FIG. 16, it is known that the luminance of the light emitting element of the present invention, which is obtained in applying the predetermined voltage thereto, is higher than that of the light emitting element of the comparative example. In addition, it is known that the current flowing through the light emitting element of the present invention upon applying the predetermined voltage thereto is higher than that of the light emitting element of the comparative example. Consequently, the light emitting element of the present invention is a favorable element capable of operating at low driving voltage.

Each of the light emitting elements as shown in Embodiment 1 and Embodiment 2 comprises layers functioning as a hole injecting layer, a hole transporting layer, an electron transporting layer and the like, together with a layer functioning as a light emitting layer. However, these layers may not be necessary to be formed. Further, after forming the layer functioning as the light emitting layer, the layer generating electrons is formed, followed by forming the layer generating holes in Embodiment 1 and Embodiment 2. However, the method for manufacturing the light emitting element according to the present invention is not limited thereto. For example, after forming the layer generating the holes, the layer generating electrons may be formed, followed by forming a layer including a layer functioning as a light emitting layer.

Embodiment 3

Figure 18:
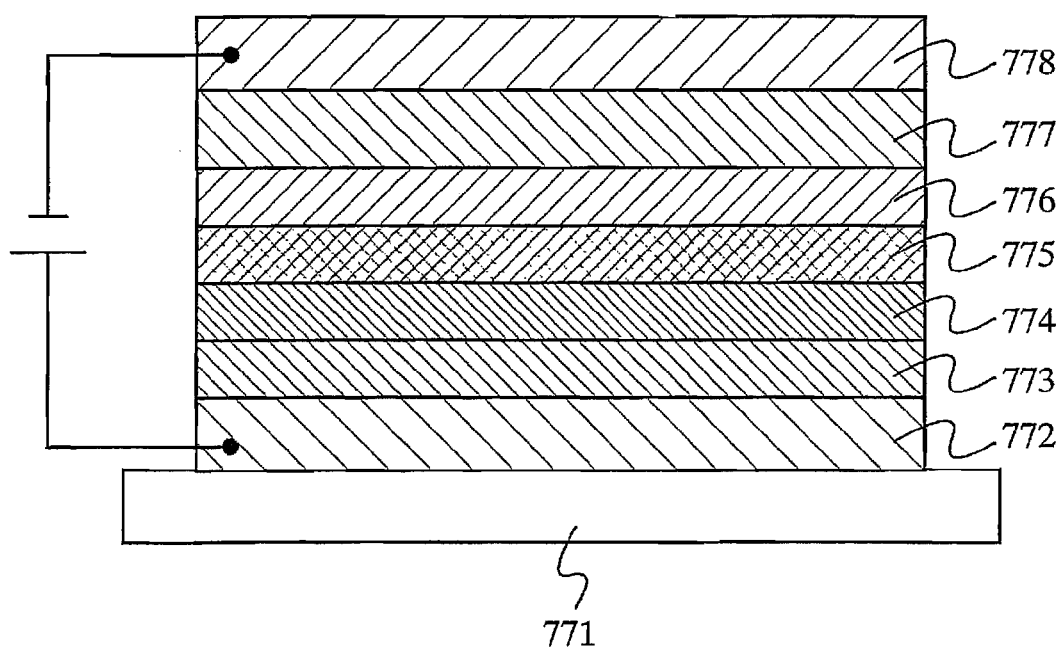
FIG. 18 is a view showing a laminated structure of a light emitting element according to the invention.

Methods for manufacturing six light emitting elements having different thicknesses of layers generating holes (i.e., a light emitting element 5, a light emitting element 6, a light emitting element 7, a light emitting element 8, a light emitting element 9, a light emitting element 10 and a light emitting element 11), and characteristics of these elements will be described in this embodiment with reference to FIG. 18.

Indium tin oxide was formed over a substrate 771 by sputtering to form a second electrode 772 with a thickness of 110 nm. A substrate made of glass was used as the substrate 771.

A layer 773 including CuPC was formed on the second electrode 772 by vacuum evaporation of the CuPC. The thickness of the layer 773 was set to be 20 nm.

A layer 774 including NPB was next formed on the layer 773 by vacuum evaporation of the NPB. The thickness of the layer 774 was set to be 40 nm.

Next, a layer 775 including $Alq_3$ and coumarin 6 was formed on the layer 774 by co-evaporation of the $Alq_3$ and the coumarin 6. The $Alq_3$-coumarin 6 weight ratio was adjusted to satisfy 1:0.003 so that the coumarin 6 was dispersed in the $Alq_3$. The thickness of the layer 775 was set to be 40 nm.

A second layer 776 including $Alq_3$ and lithium (Li) was formed on the layer 775 by co-evaporation of the $Alq_3$ and the lithium. The $Alq_3$-lithium weight ratio was adjusted to satisfy 1:0.01 so that the lithium was dispersed in the $Alq_3$. The thickness of the second layer 776 was set to be 30 nm.

Next, a first layer 777 including NPB and molybdenum oxide was formed on the second layer 776 by co-evaporation of the NPB and the molybdenum oxide. The molar ratio between the NPB and the molybdenum oxide (i.e., molybdenum oxide/NPB) was set to be 1.25. At this moment, with respect to the light emitting element 5, the thickness of the first layer 777 was set to be 0 nm. That is, the first layer 777 was not formed in the light emitting element 5. With respect to the light emitting element 6, the thickness of the first layer 777 was set to be 100 nm. With respect to the light emitting element 7, the thickness of the first layer 777 was set to be 120 nm. With respect to the light emitting element 8, the thickness of the first layer 777 was set to be 140 nm. With respect to the light emitting element 9, the thickness of the first layer 777 was set to be 160 nm. With respect to the light emitting element 10, the thickness of the first layer 777 was set to be 180 nm. With respect to the light emitting element 11, the thickness of the first layer 777 was set to be 200 nm.

Subsequently, a first electrode 778 was formed on the first layer 777 by vacuum evaporation of aluminum. The thickness of the first electrode 778 was set to be 100 nm.

When the current flows through each of the above-manufactured light emitting elements by applying the voltage thereto such that a potential of the second electrode 772 is higher than that of the first electrode 778, holes generated in the first layer 777 are injected in the first electrode 778 while electrons generated in the second layer 776 are injected in the layer 775. The holes are injected in the layer 773 from the second electrode 772. The holes injected from the second electrode 772 and the electrons injected from the second layer 776 are recombined in the layer 775, allowing the coumarin 6 to emit light. Accordingly, the layer 775 serves as a light emitting layer. Further, the layer 773 serves as a hole injecting layer. The layer 774 serves as a hole transporting layer. In each light emitting element of the present embodiment, the substances included in the layer 775 and a substance with an electron transporting property included in the second layer 776 are both $Alq_3$ and have equivalent electron affinity.

Figure 19:
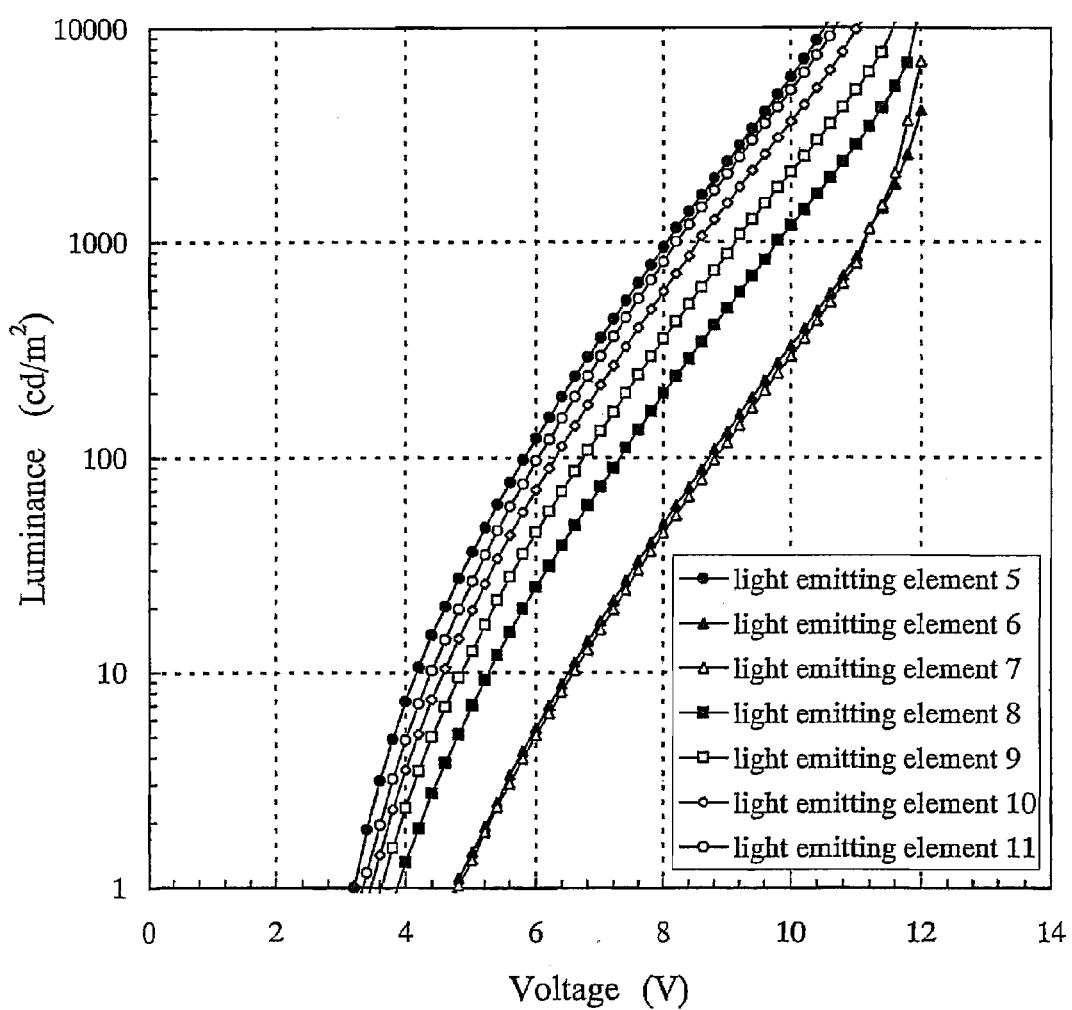
FIG. 19 is a graph showing the voltage-luminance characteristics of a light emitting element according to the invention.
Figure 20:
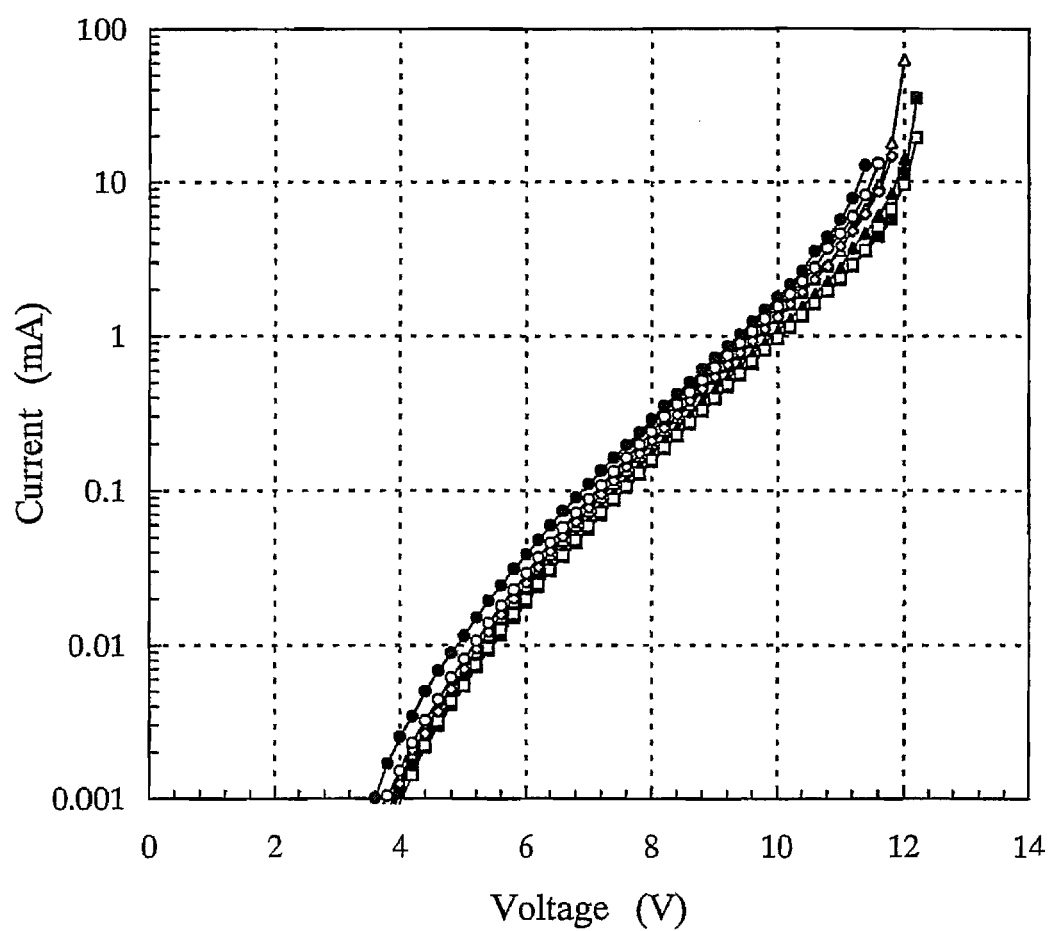
FIG. 20 is a graph showing the voltage-current characteristics of a light emitting element according to the invention.
Figure 21:
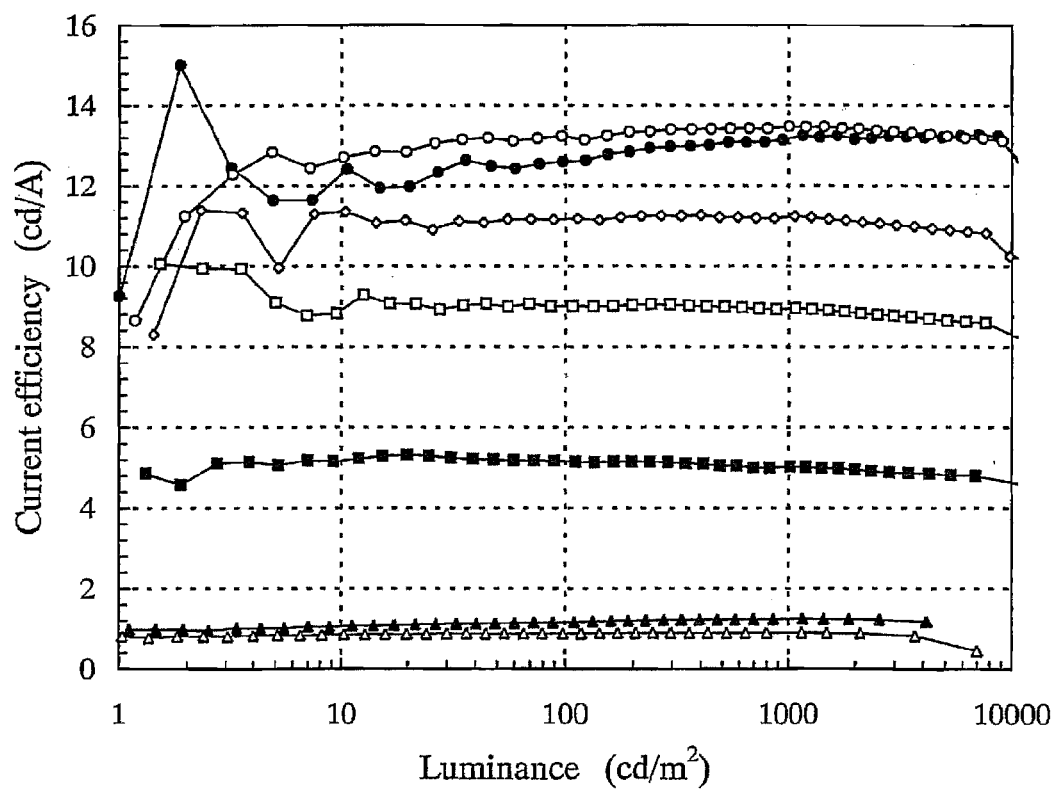
FIG. 21 is a graph showing the luminance-current efficiency characteristics of a light emitting element according to the invention.

FIG. 19 shows the voltage-luminance characteristics of the light emitting elements according to the present embodiment, FIG. 20 shows the voltage-current characteristics thereof, and FIG. 21 shows the luminance-current efficiency characteristics thereof. In FIG. 19, a horizontal axis represents the voltage (V) while a perpendicular axis represents the luminance ($cd/m^2$). In FIG. 20, a horizontal axis represents the voltage (V) while a perpendicular axis represents the current (mA). In FIG. 21, a horizontal axis represents the luminance ($cd/m^2$) while a perpendicular axis represents the current efficiency (cd/A). In FIGS. 19, 20 and 21, curves marked by • indicate the characteristics of the light emitting element 5, curves marked by ▲ indicate the characteristics of the light emitting element 6, curves marked by ∆ indicate the characteristics of the light emitting element 7, curves marked by ■ indicate the characteristics of the light emitting element 8, curves marked by □ indicate the characteristics of the light emitting element 9, curves marked by ◇ indicate the characteristics of the light emitting element 10, and curves marked by ○ indicate the characteristics of the light emitting element 11, respectively.

According to FIG. 20, it is known that there is almost no difference in the amount of current that flows through the respective light emitting elements upon applying the given voltage to the light emitting elements even when the thicknesses of the first layers 777 having a function of generating holes are varied. Meanwhile, it is also known that the amount of luminance upon applying the given voltage to the respective light emitting elements is varied greatly depending on the thicknesses of the first layers 777 according to FIG. 19.

Figure 22:
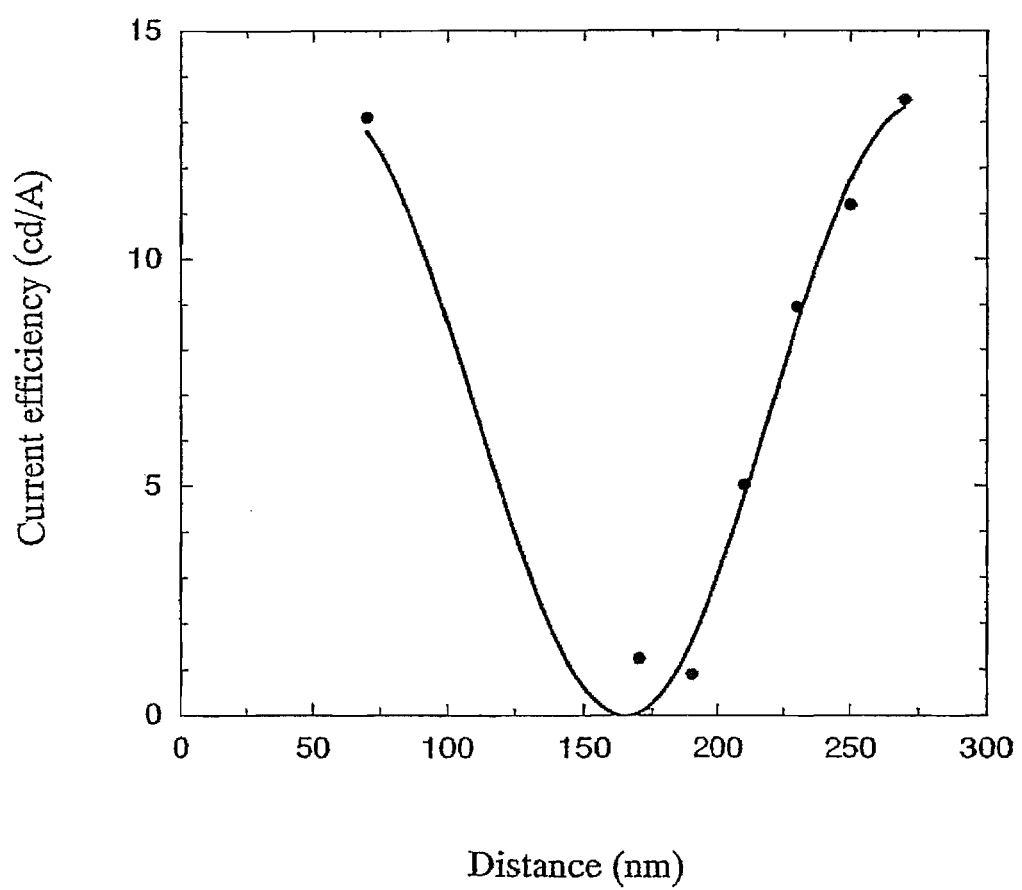
FIG. 22 is a graph showing results obtained by measuring the change in current efficiency (cd/A) with respect to the distance (nm) of a layer 775 to a first electrode 778.

FIG. 22 is a graph in which the current efficiency (cd/A) with respect to a distance (nm) between the layer 775 and the first electrode 778 is plotted (marked by •). The curve in FIG. 22 is an approximated curve showing the change in current efficiency. Further, the current efficiency is obtained when the light emitting element emits light at the luminance of 1,000 $cd/m^2$. In FIG. 22, a horizontal axis represents the distance (nm) while a perpendicular axis represents the current efficiency (cd/A). According to FIG. 22, it is known that the current efficiency is changed depending on the distance between the layer 775 and the first electrode 778 (i.e., a sum of the respective film thicknesses of the layer 775, the second layer 776 and the first layer 777), and the current efficiency is gradually increased when the distance between the layer 775 and the first electrode 778 is more than 200 nm. It is thought that this phenomenon is caused due to the effect of interference of light, wherein when an optical distance between a light emitting region and the first electrode (i.e., reflectance x distance) is (2m—1)/4 times (i.e., 1/4, 3/4, 5/4 . . . times) of the light emission wavelength, the light extraction efficiency is increased, whereas when the optical distance therebetween is m/2 times (i.e., 1/2, 1, 3/2 . . . times) of the emission wavelength, the light extraction efficiency is reduced. Consequently, in the present embodiment, by setting the thickness of the first layer 777 to be more than 160 nm, light generated in the light emitting layer can be emitted to the outside effectively while preventing the short-circuiting between the electrodes. In addition, a light emitting element having slight increase in the resistance value that is caused by increase in thickness can be obtained.

Figure 23A:
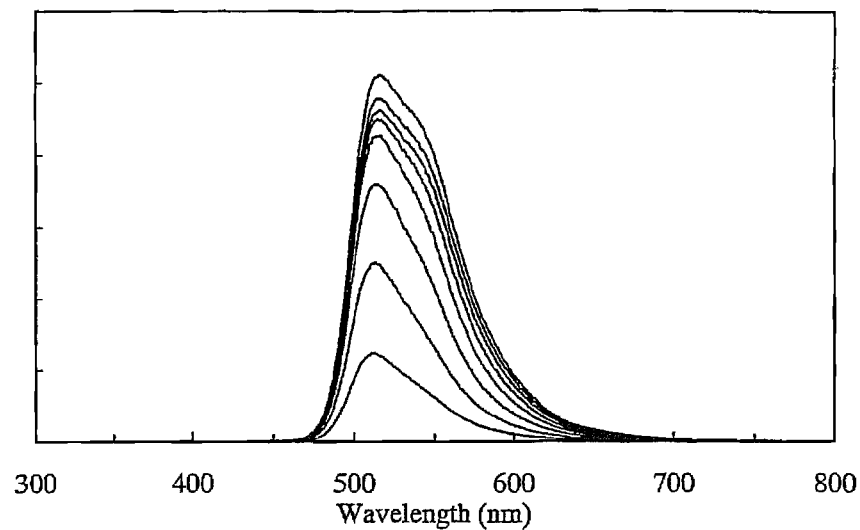
FIGS. 23A to 23C are graphs showing results obtained by measuring the change in shape of light emission spectrum depending on an angle of seeing a light emitting surface.
Figure 23B:
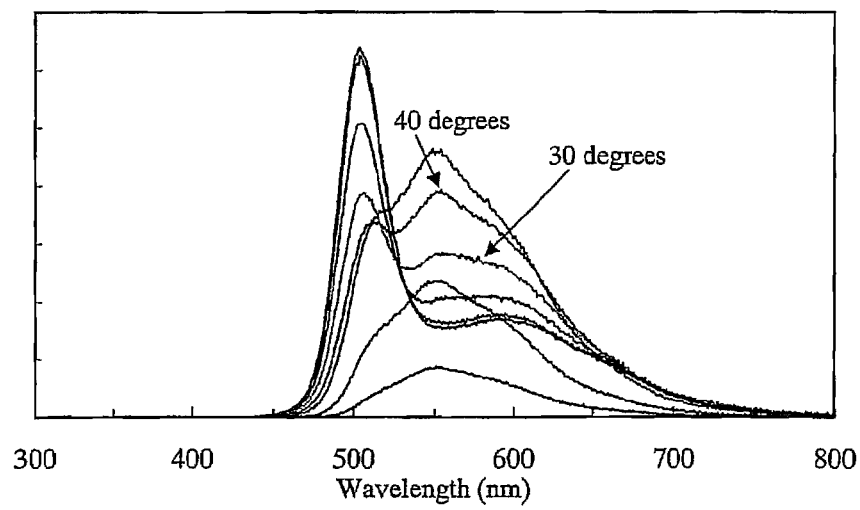
Figure 23C:
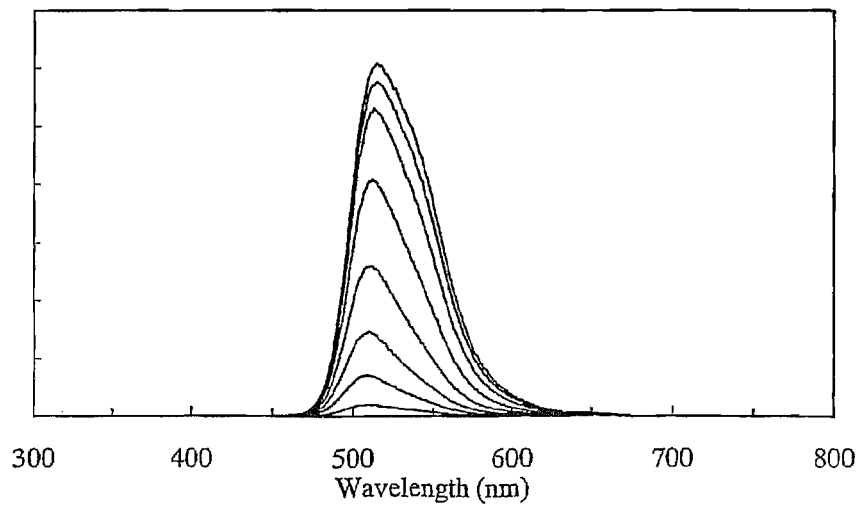

The results of measuring the change in emission spectrum depending on an angle of seeing a light emitting surface with respect to the light emitting elements 5, 7 and 11 are shown in FIGS. 23A, 23B and 23C, respectively. In FIGS. 23A, 23B and 23C, a horizontal axis represents a wavelength (nm) while a perpendicular axis represents the emission intensity (at an given unit).

The emission spectrum is measured by changing an angle of seeing the light emitting surface, i.e., an angle between a normal line to the light emitting surface and an normal line to an measurement surface, every 10° C. in a range of 0 to 70 degrees.

FIG. 23A shows the results of measuring the change in emission spectrum of the light emitting element 5. FIG. 23B shows the results of measuring the change in emission spectrum of the light emitting element 7. FIG. 23C shows the results of measuring the change in emission spectrum of the light emitting element 11.

In FIG. 23B, the emission spectrum is changed depending on the angle of seeing the light emitting surface, wherein when the angle is less than 30 degrees, the emission spectrum with about 507 nm shows a maximal value of the emission intensity and when the angle is more than 40 degrees, the emission spectrum with about 555 nm shows a maximal value of the emission intensity. Accordingly, it is known that the shape of the emission spectrum of the light emitting element 7 is largely changed depending on the change in angle so that there is a major change in emission spectrum depending on the angle of seeing the light emitting surface. On the other hand, in FIGS. 23A and 23C, although the emission intensity is reduced with increasing the angle of seeing the light emitting surface, the wavelength showing a maximal value of emission intensity is not changed. Accordingly, it is known that with respect to the light emitting elements 5 and 11, there is almost no variation in the shape of emission spectrum in accordance with the change in angle, resulting in slight variation in emission spectrum depending on the angle of seeing the light emitting surface.

Embodiment 4

One embodiment of the light emitting element according to the present invention will be described. Further, a light emitting element of this embodiment is similar to that of Embodiment 2, except that the molar ratio between the NPB and the molybdenum oxide included in the second layer is different from that of the light emitting element of Embodiment 2. Therefore, the light emitting element of this embodiment will be described with reference to FIG. 14.

Indium tin oxide including silicon was formed over a substrate 731 by sputtering to form a second electrode 732 with a thickness of 110 nm. A substrate made of glass was used as the substrate 731.

Next, a layer 733 including molybdenum oxide and NPB was formed on the second electrode 732 by co-evaporation of the molybdenum oxide and the NPB. The thickness of the layer 733 was set to be 50 nm. The molar ratio between the molybdenum oxide and the NPB (i.e., molybdenum oxide/NPB) was adjusted to be 1.0.

A layer 734 including NPB was next formed on the layer 733 by vacuum evaporation of the NPB. The thickness of the layer 734 was set to be 10 nm.

A layer 735 including tris(8-quinolinolato)aluminum (abbreviation: $Alq_3$) and coumarin 6 was formed on the layer 734 by co-evaporation of the $Alq_3$ and the coumarin 6. The $Alq_3$-coumarin 6 weight ratio (i.e., $Alq_3$:coumarin 6) was adjusted to be 1:0.01 so that the coumarin 6 was dispersed in the $Alq_3$. The thickness of the layer 735 was set to be 40 nm. Further, the co-evaporation is an evaporation method that is performed simultaneously from plural evaporation sources.

Next, Alq$_3$ was formed on the layer 735 by vacuum evaporation to form a layer 736 including the Alq$_3$ with a thickness of 10 nm.

A second layer 737 including Alq$_3$ and lithium (Li) was formed on the layer 736 by co-evaporation of the Alq$_3$ and the lithium. The Alq$_3$-lithium weight ratio (i.e., Alq$_3$:lithium) was adjusted to be 1:0.01 so that the lithium is dispersed in the Alq$_3$. The thickness of the second layer 737 was set to be 10 nm.

A first layer 738 including NPB and molybdenum oxide was formed on the second layer 737 by co-evaporation of the NPB and the molybdenum oxide. The molar ratio between the NPB and the molybdenum oxide (i.e., molybdenum oxide/NPB) was adjusted to be 2.0. The thickness of the first layer 738 was set to be 20 nm.

A first electrode 739 was formed on the first layer 738 by vacuum evaporation of aluminum. The thickness of the first electrode 739 was set to be 100 nm.

When the current flows through the light emitting element manufactured above by applying the voltage thereto such that a potential of the second electrode 732 is higher than that of the first electrode 739, holes generated in the first layer 738 are injected in the first electrode 739 while electrons generated in the second layer 737 are injected in the layer 736. The holes are injected in the first layer 733 from the second electrode 732. The holes injected from the second electrode 732 and the electrons injected from the second layer 737 are recombined in the layer 735, allowing the coumarin 6 to emit light. Accordingly, the layer 735 serves as a light emitting layer. Further, the layer 733 serves as a hole injecting layer. The layer 734 serves as a hole transporting layer. The layer 736 serves as an electron transporting layer.

Figure 25:
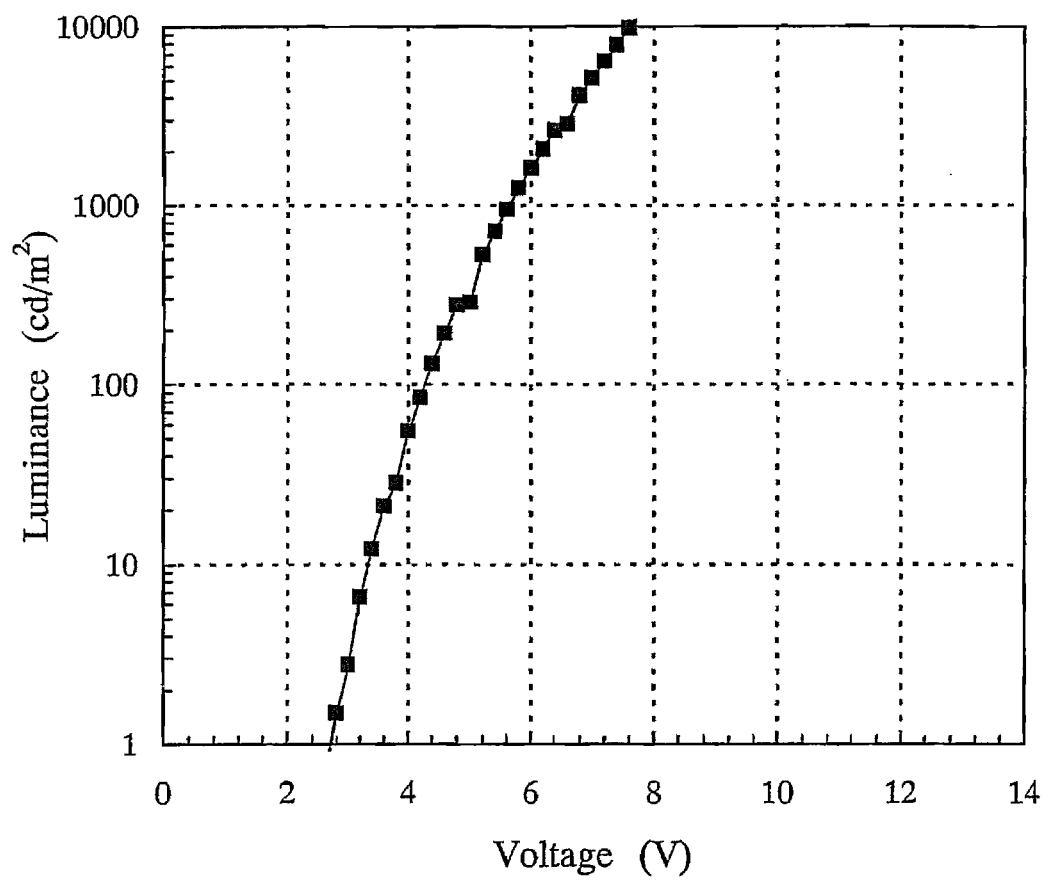
FIG. 25 is a graph showing the voltage-luminance characteristics of a light emitting element according to the invention.

The voltage-luminance characteristics of the light emitting element manufactured according to the present embodiment are shown in FIG. 25. In FIG. 25, a horizontal axis represents the voltage (V) while a perpendicular axis represents the luminance (cd/m$^2$). According to FIG. 25, it is known that the light emitting element of the present embodiment is operated favorably.

Embodiment 5

Another embodiment of the light emitting element according to the present invention will be described. A light emitting element of the present embodiment is similar to that of Embodiment 2, except that the second layer includes DNTPD rather than the NPB and the molar ratio of substances included in the second layer is different from those of the light emitting element of Embodiment 2. Therefore, the light emitting element of the present embodiment will be described with reference to FIG. 14.

Indium tin oxide including silicon was formed on a substrate 731 by sputtering to form a second electrode 732 with a thickness of 110 nm. Further, a substrate made of glass was used as the substrate 731.

Next, a layer 733 including molybdenum oxide and NPB was formed on the second electrode 732 by co-evaporation of the molybdenum oxide and the NPB. The thickness of the layer 733 was set to be 50 nm. The molar ratio between the NPB and the molybdenum oxide (molybdenum oxide/NPB) was adjusted to be 1.0.

A layer 734 including NPB was formed on the layer 733 by vacuum evaporation of the NPB. The thickness of the layer 734 was set to be 10 nm.

A layer 735 including tris(8-quinolinolato)aluminum (abbreviation: Alq$_3$) and coumarin 6 was formed on the layer 734 by co-evaporation of the Alq$_3$ and the coumarin 6. The Alq$_3$-coumarin 6 weight ratio (i.e., Alq$_3$:coumarin 6) was adjusted to be 1:0.01 so that the coumarin 6 was dispersed in the Alq$_3$. The thickness of the layer 735 was set to be 40 nm. Further, the co-evaporation is an evaporation method that is performed simultaneously from plural evaporation sources.

Next, a layer 736 including Alq$_3$ was formed on the layer 735 by vacuum evaporation of the Alq$_3$. The thickness of the layer 736 was set to be 10 nm.

A second layer 737 including Alq$_3$ and lithium (Li) was formed on the layer 736 by co-evaporation of the Alq$_3$ and the lithium. The Alq$_3$-lithium weight ratio (i.e., Alq$_3$:lithium) was adjusted to be 1:0.01 so that the lithium was dispersed in the Alq$_3$. The thickness of the second layer 737 was set to be 10 nm.

Next, a first layer 738 including DNTPD and molybdenum oxide was formed on the second layer 737 by co-evaporation of the DNTPD and the molybdenum oxide. The molar ratio between the DNTPD and the molybdenum oxide (molybdenum oxide/DNTPD) was adjusted to be 3.1. The thickness of the first layer 738 was set to be 20 nm.

A first electrode 739 with a thickness of 100 nm was formed on the first layer 738 by vacuum evaporation of aluminum.

When the current flows through the above-manufactured light emitting element by applying the voltage thereto such that a potential of the second electrode 732 is higher than that of the first electrode 739, holes generated in the first layer 738 are injected in the first electrode 739 while electrons generated in the second layer 737 are injected in the layer 736. The holes are injected in the layer 733 from the second electrode 732. The holes injected from the second electrode 732 and the electrons injected from the second layer 737 are recombined in the layer 735 so that the coumarin 6 emits light. Accordingly, the layer 735 serves as a light emitting layer. Further, the layer 733 serves as a hole injecting layer. The layer 734 serves as a hole transporting layer. The layer 736 serves as an electron transporting layer.

Figure 26:
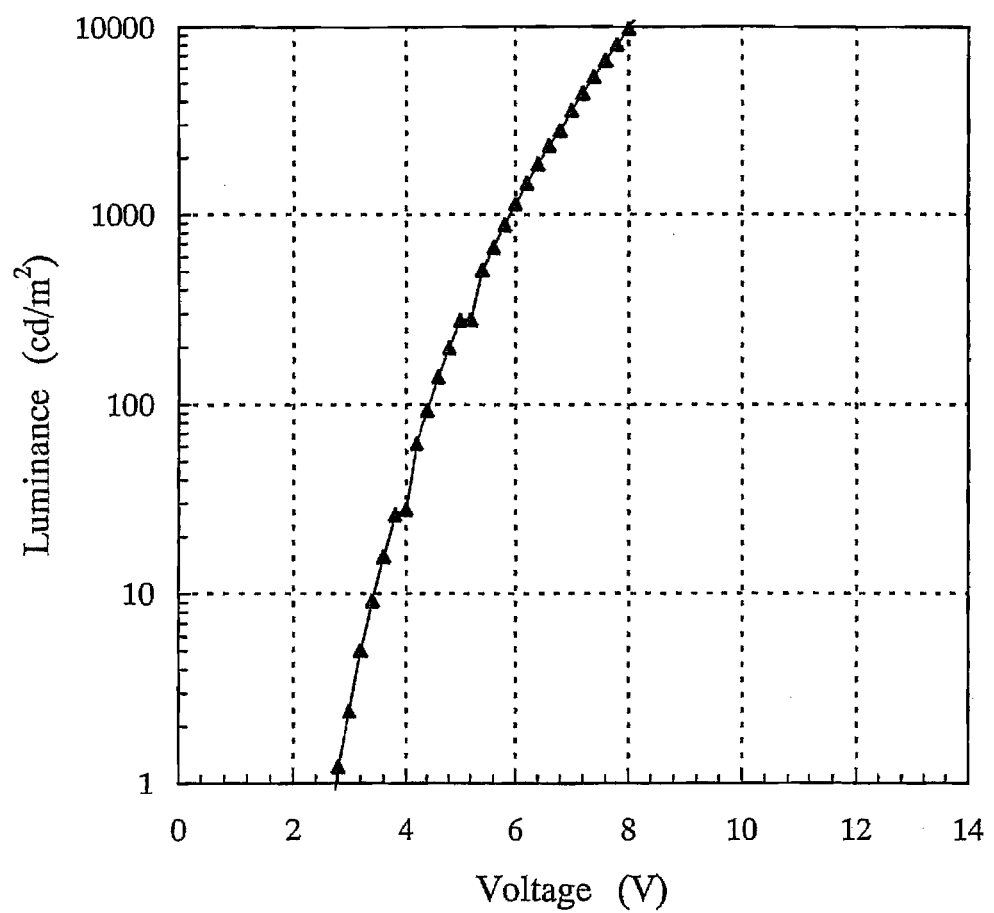
FIG. 26 is a graph showing the voltage-luminance characteristics of a light emitting element according to the invention.

The voltage-luminance characteristics of the light emitting element manufactured according to the present embodiment are shown in FIG. 26. In FIG. 26, a horizontal axis represents the voltage (V) while a perpendicular axis represents the luminance (cd/m$^2$). According to FIG. 26, the light emitting element having the structure of the present embodiment is operated favorably.

EXPLANATION OF REFERENCE

10: substrate, 11: transistor, 12: light emitting element, 13: first electrode, 14: second electrode, 15: layer, 16: first interlayer insulating film, 16a: interlayer insulating film, 16b: interlayer insulating film, 16c: interlayer insulating film, 17: wiring, 18: partition wall layer, 19: second interlayer insulating film, 19a: interlayer insulating film, 19b: interlayer insulating film, 101: first electrode, 102: second electrode, 111: first layer, 112: second layer, 113: third layer, 121: electron transporting layer, 122: light emitting layer, 123: hole transporting layer, 124: hole injecting layer, 201: first electrode, 202: second electrode, 211: first layer, 212: second layer, 213: third layer, 221: electron transporting layer, 222: light emitting layer, 223: hole transporting layer, 224: hole injecting layer, 501: sub-frame, 501a: writing period, 501b: holding period, 502: sub-frame, 502a: writing period, 502b: holding period, 503: sub-frame, 503a: writing period, 503b: holding period, 504: sub-frame, 504a: writing period, 504b: holding period, 504c: erasing period, 504d: non light emitting period, 701: substrate, 702: second electrode, 703: layer, 704: layer, 705: layer, 706: layer, 707: second layer, 708: first layer, 709: first electrode, 731: substrate, 732: second electrode, 733: layer, 734: layer, 735: layer, 736: layer, 737: second layer, 738: first layer, 739: first electrode, 751: substrate, 752: second electrode, 753: layer, 754: layer, 755: layer, 756: layer, 757: second layer, 758: first electrode, 771: substrate, 772: second electrode, 773: layer, 774: layer, 775: layer, 776: second layer, 777: first layer, and 778: first electrode, 901: first transistor, 902: second transistor, 903: light emitting element, 911: gate signal line, 912. source signal line, 913: writing gate signal line driver circuit, 914: erasing gate signal line driver circuit, 915: source signal line driver circuit, 916: power source, 917: current supply line, 918: switch, 919: switch, 920: switch, 1001: first transistor, 1002: second transistor, 1003: gate signal line, 1004: source signal line, 1005: current supply line, 1006: electrode, 5521: main body, 5522: housing, 5523: display portion, 5524: keyboard, 5531: display portion, 5532: housing, 5533: speaker, 5551: display portion, 5552: main body, 5553: antenna, 5554: audio output portion, 5555: audio input portion, 5556: operation switch, 5557: operation switch, 6500: substrate, 6503: flexible printed circuit (FPC), 6504: printed wiring board (PWB), 6511: pixel portion, 6512: source signal line driver circuit, 6513: writing gate signal line driver circuit, 6514: erasing gate signal line driver circuit

What is claimed is:

1. A light emitting device comprising:
an anode comprising a metal;
a light emitting layer over the anode;
a second layer over the light emitting layer, the second layer comprising a first substance with an electron transporting property and a second substance with an electron donating property with respect to the first substance;
a first layer over and in direct contact with the second layer, the first layer comprising a third substance with a hole transporting property and a fourth substance with an electron accepting property with respect to the third substance; and
a transparent cathode over and in direct contact with the first layer.

2. The light emitting device according to claim 1, wherein the electron transporting property of the first substance is greater than a hole transporting property of the first substance.

3. The light emitting device according to claim 1, wherein the first substance is a metal complex.

4. The light emitting device according to claim 1, wherein the second substance is an alkali metal, an alkali earth metal, or a rare-earth metal.

5. The light emitting device according to claim 1, wherein the hole transporting property of the third substance is greater than an electron transporting property of the third substance.

6. The light emitting device according to claim 1, wherein the third substance is an aromatic amine compound or a phthalocyanine compound.

7. The light emitting device according to claim 1, wherein the fourth substance is molybdenum oxide or vanadium oxide.

8. The light emitting device according to claim 1, further comprising a third layer between the anode and the light emitting layer,
wherein the third layer comprises a substance selected from a metal oxide, an aromatic amine compound, and a phthalocyanine compound.

9. The light emitting device according to claim 8, wherein the metal oxide is molybdenum oxide, vanadium oxide, ruthenium oxide, tungsten oxide, or manganese oxide.

10. The light emitting device according to claim 1, further comprising a third layer between the anode and the light emitting layer,
wherein the third layer comprises a fifth substance with a hole transporting property and a sixth substance with an electron accepting property with respect to the fifth substance.

11. The light emitting device according to claim 10, wherein the fifth substance is an aromatic amine compound or a phthalocyanine compound.

12. The light emitting device according to claim 10, wherein the sixth substance is molybdenum oxide or vanadium oxide.

13. The light emitting device according to claim 1, wherein the anode comprises at least one of gold, platinum, nickel, tungsten, chromium, molybdenum, iron, cobalt, copper, and palladium.

14. The light emitting device according to claim 1, wherein the transparent cathode comprises indium oxide.

15. An electronic appliance comprising the light emitting device according to claim 1.

16. A lighting appliance comprising the light emitting device according to claim 1.

* * * * *